US008563988B2

(12) United States Patent
Uchida et al.

(10) Patent No.: US 8,563,988 B2
(45) Date of Patent: Oct. 22, 2013

(54) SEMICONDUCTOR ELEMENT AND MANUFACTURING METHOD THEREFOR

(75) Inventors: Masao Uchida, Osaka (JP); Koutarou Tanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/878,742

(22) PCT Filed: Oct. 27, 2011

(86) PCT No.: PCT/JP2011/006020
§ 371 (c)(1),
(2), (4) Date: Apr. 10, 2013

(87) PCT Pub. No.: WO2012/056705
PCT Pub. Date: May 3, 2012

(65) Prior Publication Data
US 2013/0214291 A1    Aug. 22, 2013

(30) Foreign Application Priority Data
Oct. 29, 2010    (JP) ................................ 2010-243137

(51) Int. Cl.
*H01L 21/00*    (2006.01)
(52) U.S. Cl.
USPC ...................... 257/77; 257/E21.054; 438/197
(58) Field of Classification Search
USPC .............................. 257/77, E21.054; 438/197
See application file for complete search history.

(56) References Cited

U.S. PATENT DOCUMENTS 5,170,231 A * 12/1992 Fujii et al. ........................ 257/77
5,233,215 A *  8/1993 Baliga ............................ 257/490
(Continued)

FOREIGN PATENT DOCUMENTS

JP    2003-163351 A    6/2003
JP    2004-363328 A    12/2004
(Continued)

OTHER PUBLICATIONS

International Search Report for corresponding International Application No. PCT/JP2011/006020 mailed Jan. 24, 2012.
(Continued)

*Primary Examiner* — Jarrett Stark
*Assistant Examiner* — Nicholas Tobergte
(74) *Attorney, Agent, or Firm* — Renner, Otto, Boisselle & Sklar, LLP

(57)    ABSTRACT

As viewed along a normal to the principal surface of a substrate 101, this semiconductor element 100 has a unit cell region 100*ul* and a terminal region 100*f* located between the unit cell region and an edge of the semiconductor element. The terminal region 100*f* includes a ring region 103*f* of a second conductivity type which is arranged in a first silicon carbide semiconductor layer 102 so as to contact with a drift region 102*d*. The ring region includes a high concentration ring region 103*af* which contacts with the surface of the first silicon carbide semiconductor layer and a low concentration ring region 103*bf* which contains an impurity of the second conductivity type at a lower concentration than in the high concentration ring region and of which the bottom contacts with the first silicon carbide semiconductor layer. A side surface of the high concentration ring region 103*af* contacts with the drift region 102*d*. As viewed along a normal to the principal surface of the semiconductor substrate, the high concentration ring region and the low concentration ring region are identical in contour.

19 Claims, 12 Drawing Sheets

(56) References Cited

U.S. PATENT DOCUMENTS

| | | | |
|---|---|---|---|
| 5,744,994 A | 4/1998 | Williams | |
| 5,929,690 A | 7/1999 | Williams | |
| 6,566,726 B1 * | 5/2003 | Onose et al. | 257/490 |
| 7,728,382 B2 * | 6/2010 | Tsuzuki et al. | 257/341 |
| 7,791,308 B2 * | 9/2010 | Kitabatake et al. | 318/801 |
| 7,977,210 B2 * | 7/2011 | Ota et al. | 438/459 |
| 8,168,999 B2 * | 5/2012 | Tsuzuki et al. | 257/143 |
| 8,222,107 B2 * | 7/2012 | Tanaka et al. | 438/268 |
| 8,362,519 B2 * | 1/2013 | Soeno | 257/140 |
| 8,471,267 B2 * | 6/2013 | Hayashi et al. | 257/77 |
| 2007/0200138 A1 | 8/2007 | Ozeki et al. | |
| 2008/0121993 A1 | 5/2008 | Hefner et al. | |
| 2008/0224150 A1 | 9/2008 | Suzuki et al. | |
| 2008/0277669 A1 | 11/2008 | Okuno et al. | |
| 2009/0302376 A1 | 12/2009 | Inoue et al. | |
| 2012/0057386 A1 | 3/2012 | Adachi et al. | |

FOREIGN PATENT DOCUMENTS

| | | |
|---|---|---|
| JP | 2007-173705 A | 7/2007 |
| JP | 2007-227806 A | 9/2007 |
| JP | 2008-010506 A | 1/2008 |
| JP | 2008-159927 A | 7/2008 |
| JP | 2008-227151 A | 9/2008 |
| JP | 2009-065185 A | 3/2009 |
| JP | 2009-524217 T | 6/2009 |
| JP | 4356767 B | 8/2009 |
| JP | 4367508 A | 9/2009 |
| JP | 2009-289904 A | 12/2009 |
| JP | 2010-509771 T | 3/2010 |
| WO | 2007/084282 A1 | 7/2007 |
| WO | 2008/057438 A2 | 5/2008 |
| WO | 2010/125819 A1 | 11/2010 |
| WO | 2011/141981 A1 | 11/2011 |

OTHER PUBLICATIONS

Form PCT/IPEA/408 (Written Opinion) for corresponding International Application No. PCT/JP2011/006020 dated Oct. 23, 2012.

The International Preliminary Report on Patentability for corresponding International Application No. PCT/JP2011/006020 dated Jan. 29, 2013.

Co-pending U.S. Appl. No. 13/519,010, filed Jun. 25, 2012.

Supplementary European Search Report for corresponding European Application No. EP 11 83 5849 issued on Jul. 26, 2013.

\* cited by examiner

FIG.1
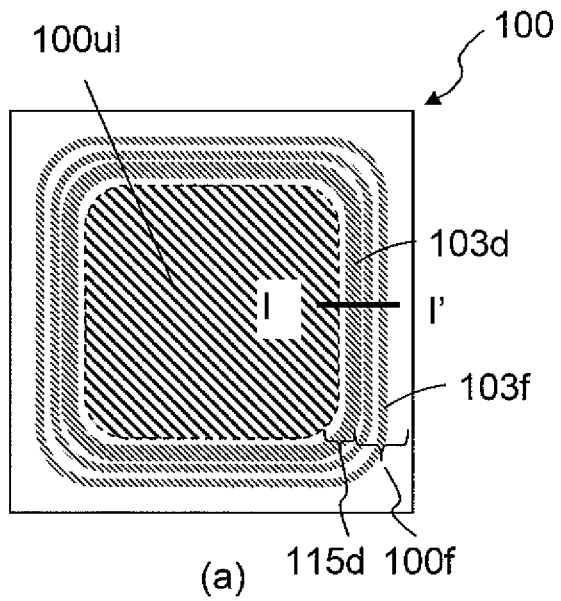
(a)
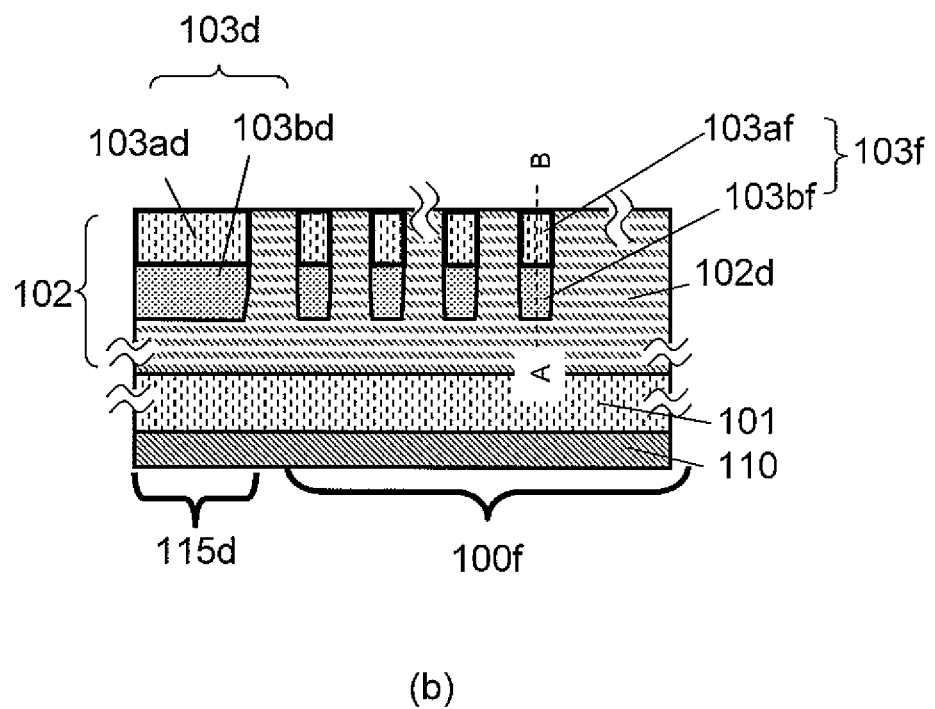
(b)

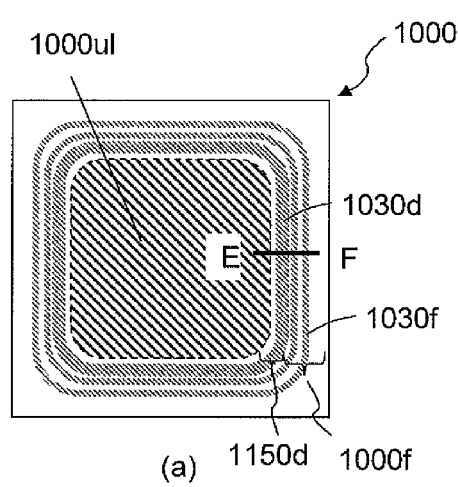
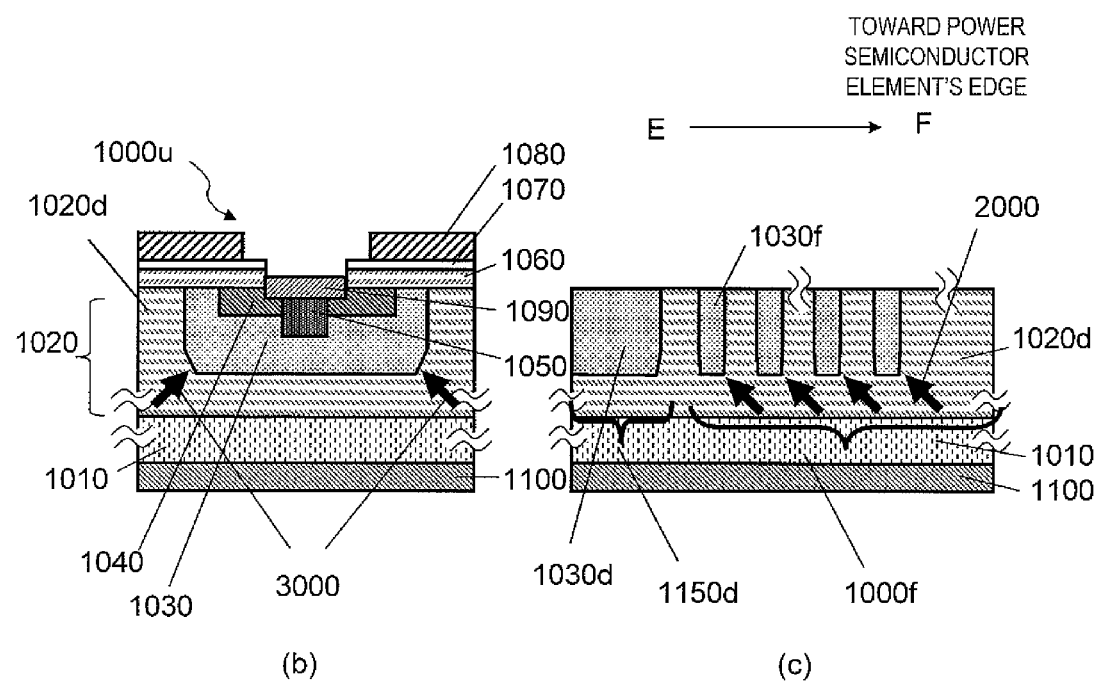
FIG.12

SEMICONDUCTOR ELEMENT AND MANUFACTURING METHOD THEREFOR

TECHNICAL FIELD

The present invention relates to a semiconductor element and a method for fabricating the same. More particularly, the present invention relates to a silicon carbide semiconductor element (as a power semiconductor, device) which can be used in applications that require a high breakdown voltage and a large amount of current.

BACKGROUND ART

Silicon carbide (SiC) is a high-hardness semiconductor material with a greater bandgap than silicon (Si), and has been used extensively in various types of semiconductor devices including power elements, hostile-environment elements, high temperature operating elements, and radio frequency elements. Among other things, the application of SiC to power elements with switching and rectifying functions has attracted a lot of attention. This is because a power element that uses SiC can significantly reduce the power loss compared to a Si power element. In addition, by utilizing such properties, SiC power elements can form a smaller semiconductor device than Si power elements.

A metal-insulator-semiconductor field effect transistor (MOSFET) is a typical semiconductor element among various power elements that use SiC. And a metal-oxide-semiconductor field effect transistor (MOSFET) is one of those MISFETs.

Hereinafter, a general structure for a power element that uses SiC will be described with a MOSFET taken as an example with reference to the accompanying drawings.

FIG. 12(a) is a plan view generally illustrating a semiconductor element 1000, which is mostly made of a silicon carbide (SiC) semiconductor. The semiconductor element 1000 has a unit cell region 1000ul with an element function (which may be a switching function in the case of a transistor or a rectifying function in the case of a diode) and a terminal region 1000f which complements the breakdown voltage of the region with the element function. In the unit cell region 1000ul, arranged are a number of unit cells. In the example illustrated in FIG. 12(a), the terminal region 1000f is arranged around the unit cell region 1000ul. In forming MISFETs, source and gate electrodes of unit cells (to be described later) are connected in parallel with each other and gate pads to supply an electrical signal to the semiconductor element 1000 and a source pad to make current flow through the semiconductor element 1000 are arranged (none of which are shown in FIG. 12(a)) in the unit cell region 1000ul. FIG. 12(b) is a cross-sectional view illustrating one of the unit cells that are arranged in the unit cell region 1000ul.

The unit cell 1000u includes an n-type semiconductor substrate (e.g., SiC substrate) 1010 with low resistivity, a silicon carbide semiconductor layer 1020 that has been formed on the principal surface of the semiconductor substrate 1010, a channel layer 1060 arranged on the silicon carbide semiconductor layer 1020, a gate electrode 1080 that is arranged over the channel layer 1060 with a gate insulating film 1070 interposed between them, a source electrode 1090 that contacts with the surface of the silicon carbide semiconductor layer 1020, and drain electrode 1100 arranged on the back surface of the semiconductor substrate 1010.

The silicon carbide semiconductor layer 1020 has a body region 1030, of which the conductivity type (i.e., p-type in this example) is different from that of the SiC substrate 1010, and a drift region 1020d, which is the rest of the silicon carbide semiconductor layer 1020 other than the body region 1030. More specifically, the drift region 1020d is an n$^-$-type silicon carbide semiconductor layer including an n-type impurity, of which the concentration is lower than in the SiC substrate 1010. Inside the body region 1030, defined are an n-type source region 1040 including an n-type impurity at a high concentration and a p$^+$-type contact region 1050 that includes a p-type impurity at a higher concentration than the body region 103.

The source region 1040 and the drift region 1020d are connected together through the channel layer 1060. By applying a voltage to the gate electrode 1080, a channel has been produced in a portion of the channel layer 1060 that contacts with the upper surface of the body region 1030.

Also, the contact region 1050 and the source region 1040 make ohmic contact with the source electrode 1090. Consequently, the body region 1030 is electrically connected to the source electrode 1090 via the contact region 1050.

As the unit cell 1000u has a pn junction between the body region 1030 and the drift region 1020d, the unit cell 1000u has a breakdown voltage of several hundred to several thousand volts (e.g., approximately 600 V to 10 kV) when a voltage that is positive with respect to the drain electrode 1100 is applied to the source electrode 1090. However, the electric field could be overconcentrated around the unit cell region 1000ul and the designed breakdown voltage could not be achieved. That is why in a general power element, some breakdown voltage compensating structure is usually provided for the terminal region 1000f. For example, a structure such as a field limiting ring (FLR), a junction termination edge or extension (JTE) or a resurf is provided for the terminal region 1000f (see Patent Documents Nos. 1 to 3).

FIG. 12(c) is a cross-sectional view of the terminal region 1000f, for which an FLR structure is provided as the terminal structure, as viewed on the plane E-F in the plan view shown in FIG. 12(a).

In this terminal region 1000f, a number of p-type field limiting ring (FLR) regions 1030f are arranged in an upper part of the silicon carbide semiconductor layer 1020. In the example illustrated in FIG. 12(c), each of those ring regions 1030f surrounds the unit cell region 1000ul in a ring. These ring regions 1030f can avoid overconcentration of an electric field in the unit cell region 1000ul and can minimize a decrease in breakdown voltage.

In some cases, a diode region 1150d may be provided between the unit cell region 1000ul and the terminal region 1000f. In the diode region 1150d, a p-type region 1030d is arranged in the silicon carbide semiconductor layer 1020. The p-type region 1030d and the n$^-$-type drift region 1020d form a pn junction. In this description, such a breakdown voltage compensating structure, including the ring region 1030f and the diode region 1150d, will be referred to herein as a "terminal structure".

The ring regions 1030f are usually formed by implanting ions of a p-type impurity into the silicon carbide semiconductor layer 1020. In a power element that uses silicon carbide, either Al ions or B ions may be used as ions of a p-type impurity. In that case, the ion implantation condition is set so that the ring regions 1030f have as uniform an impurity concentration profile in the depth direction as possible.

Meanwhile, Patent Documents Nos. 4 and 5 disclose arranging girdling, which is designed so as to have a certain concentration difference, in the terminal region.

CITATION LIST

Patent Literature

Patent Document No. 1: Japanese Patent Publication No. 4367508
Patent Document No. 2: PCT International Application Japanese National-Phase Laid-Open Patent Publication No. 2009-524217
Patent Document No. 3: Japanese Patent Publication No. 4356767
Patent Document No. 4: Japanese Laid-Open Patent Publication No. 2003-163351
Patent Document No. 5: Japanese. Laid-Open Patent Publication No. 2009-289904

SUMMARY OF INVENTION

Technical Problem

The breakdown voltage of such a terminal structure that uses a pn junction of a semiconductor is determined by the impurity concentration and electric field strength of that semiconductor. However, the present inventors discovered and confirmed via experiments that with the terminal structure shown in FIG. 12(c) (see Patent Documents Nos. 1 to 3, for example), a power element with the intended breakdown voltage could not be obtained in some cases. As for the terminal structures proposed in Patent Documents Nos. 4 and 5, on the other hand, the present inventors discovered via experiments that the ratio of the area of the terminal region to the overall chip area could increase as will be described in detail later.

The present inventors perfected our invention in order to overcome these problems with the related art by providing, first and foremost, a semiconductor element which can minimize such a decrease in breakdown voltage and which can have an even smaller size.

Solution to Problem

A semiconductor element according to an embodiment of the present invention includes a substrate and a first silicon carbide semiconductor layer which is arranged on the principal surface of the substrate and which includes a drift region of a first conductivity type. As viewed along a normal to the principal surface of the substrate, the semiconductor element has a unit cell region and a terminal region which is located between the unit cell region and an edge of the semiconductor element. The terminal region includes a ring region of a second conductivity type which is arranged in the first silicon carbide semiconductor layer so as to contact with the drift region. The ring region includes a high concentration ring region which contacts with the surface of the first silicon carbide semiconductor layer and a low concentration ring region which contains an impurity of the second conductivity type at a lower concentration than in the high concentration ring region and of which the bottom contacts with the first silicon carbide semiconductor layer. A side surface of the high concentration ring region contacts with the drift region. And as viewed along a normal to the principal surface of the semiconductor substrate, the high concentration ring region and the low concentration ring region are identical in contour.

A semiconductor element fabricating method according to an embodiment of the present invention is a method for fabricating the semiconductor element described above, and includes the step of forming the high concentration ring region and the low concentration ring region by implanting ions of an impurity of the second conductivity type into respective portions of the first silicon carbide semiconductor layer using a same implantation mask.

A semiconductor element fabricating method according to another embodiment of the present invention is a method for fabricating the semiconductor element described above, and includes the step of forming the high concentration ring region, the low concentration ring region, the high concentration region and the low concentration region by implanting ions of an impurity of the second conductivity type into respective portions of the first silicon carbide semiconductor layer using a same implantation mask.

A semiconductor element fabricating method according to still another embodiment of the present invention is a method for fabricating the semiconductor element described above, and includes the step of forming the high concentration ring region, the low concentration ring region, the first body region and the second body region by implanting ions of an impurity of the second conductivity type into respective portions of the first silicon carbide semiconductor layer using a same implantation mask.

A semiconductor element fabricating method according to yet another embodiment of the present invention is a method for fabricating the semiconductor element described above. The semiconductor element further includes a diode region which is arranged between the unit cell region and the terminal region. The diode region has, in the first silicon carbide semiconductor layer, a region of the second conductivity type which is arranged so as to contact with the drift region. The region of the second conductivity type includes a high concentration region which contacts with the surface of the first silicon carbide semiconductor layer and a low concentration region which contains the impurity of the second conductivity type at a lower concentration than in the high concentration region and of which the bottom contacts with the drift region. The method for fabricating the semiconductor element includes the step of forming the high concentration ring region, the low concentration ring region, the first body region, the second body region, the high concentration region and the low concentration region by implanting ions of an impurity of the second conductivity type into respective portions of the first silicon carbide semiconductor layer using a same implantation mask.

Yet another semiconductor element fabricating method according to the present invention is a method for fabricating the semiconductor element described above. The method includes the step of controlling the absolute value of a voltage, at which current starts to flow from the first ohmic electrode toward the second ohmic electrode when the first ohmic electrode and the gate electrode have an equal potential, while keeping the threshold voltage of the semiconductor element constant, by adjusting the impurity concentration and thickness of the second silicon carbide semiconductor layer while varying the impurity concentration in the first body region of the semiconductor element.

A semiconductor element according to another embodiment of the present invention includes a substrate and a first silicon carbide semiconductor layer which is arranged on the principal surface of the substrate and which includes a drift region of a first conductivity type. As viewed along a normal to the principal surface of the substrate, the semiconductor element has a unit cell region and a terminal region which is located between the unit cell region and an edge of the semiconductor element. The terminal region includes a ring region of a second conductivity type which is arranged in the first silicon carbide semiconductor layer so as to contact with the drift region. The ring region includes a high concentration ring region which contacts with the surface of the first silicon carbide semiconductor layer and a low concentration ring region which contains an impurity of the second conductivity type at a lower concentration than in the high concentration ring region and of which the bottom contacts with the first silicon carbide semiconductor layer. A side surface of the high concentration ring region contacts with the drift region. As viewed along a normal to the principal surface of the semiconductor substrate, the high concentration ring region and the low concentration ring region are identical in contour. The unit cell region has a plurality of unit cells. Each unit cell includes: a body region of the second conductivity type which is arranged adjacent to the drift region in the first silicon carbide semiconductor layer; an impurity region of the first conductivity type which is arranged in the body region; a gate insulating film which is arranged on the first silicon carbide semiconductor layer; a gate electrode which is arranged on the gate insulating film; a first ohmic electrode which is electrically connected to the impurity region; and a second ohmic electrode which is arranged on the other side of the substrate opposite from its principal surface. The semiconductor element is designed by controlling the absolute value of a voltage, at which current starts to flow from the first ohmic electrode toward the second ohmic electrode when the first ohmic electrode and the gate electrode have an equal potential, while keeping the threshold voltage of the semiconductor element constant, by adjusting the impurity concentration and thickness of the second silicon carbide semiconductor layer while varying the impurity concentration in the first body region.

BRIEF DESCRIPTION OF DRAWINGS

FIG. 1(*a*) is a schematic plan view illustrating a semiconductor element 100 as a first embodiment of the present invention and (b) is a cross-sectional view of the semiconductor element 100 as viewed on the plane I-I' and illustrates its terminal structure.

FIG. 12(*a*) is a plan view illustrating a traditional semiconductor element 1000, (b) is a cross-sectional view illustrating a unit cell 1000*u* of the semiconductor element 1000, and (c) is a cross-sectional view illustrating the terminal structure of the semiconductor element 1000.

DESCRIPTION OF EMBODIMENTS

Figure 2:
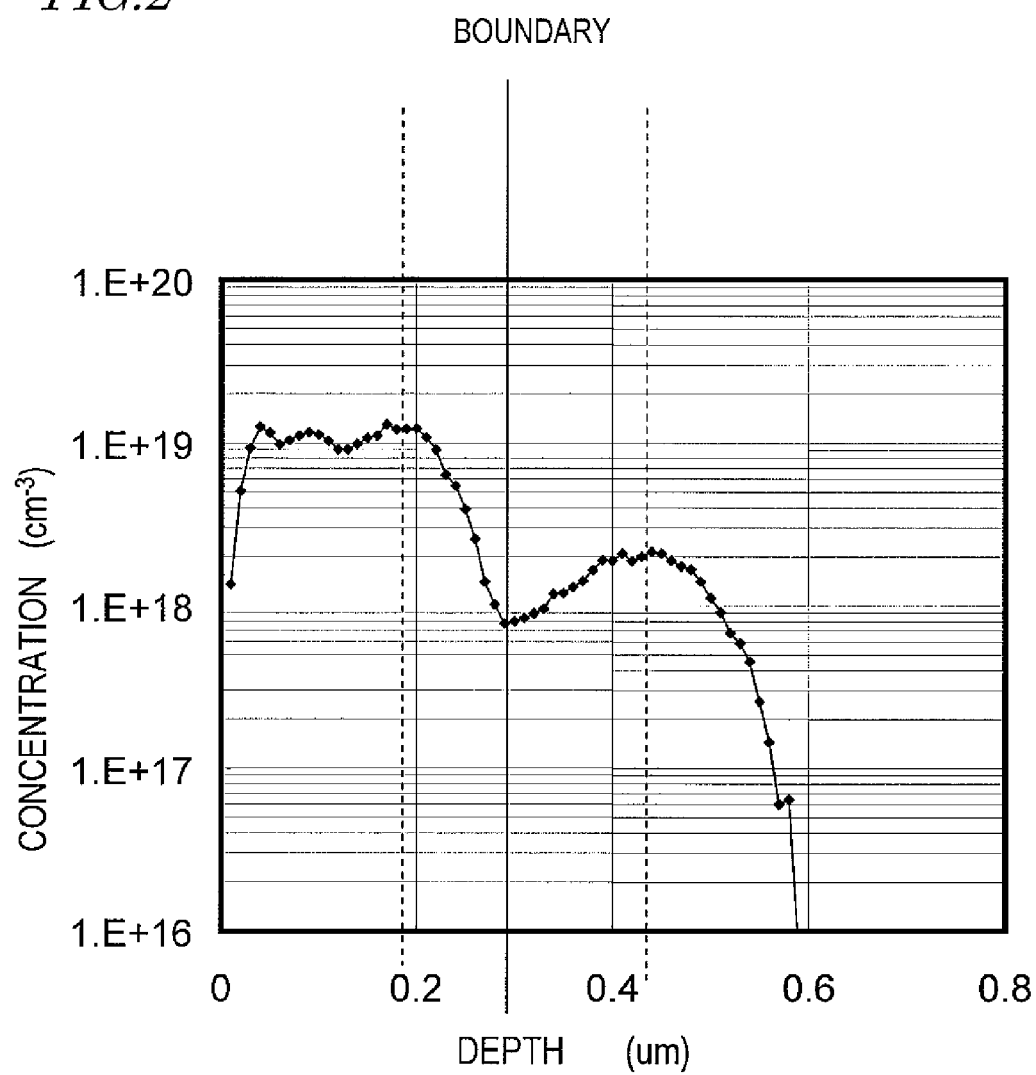
FIG. 2 Shows an exemplary ion implantation profile in the depth direction for the ring regions 103*f* of the semiconductor element 100.

As described above, the intended breakdown voltage sometimes cannot be obtained in the traditional terminal structure. The present inventors carried out extensive researches to figure out what a problem with the traditional terminal structure is. Hereinafter, our conclusion will be described with reference to FIG. 12 again.

The results of simulations the present inventors carried out revealed that the electric field was overconcentrated locally at the interface between the ring region 1030*f* and the drift region 1020*d*. Specifically, such electric field overconcentration was produced at the corner on the bottom of each ring region 1030*f* (i.e., at the corner located closer to the edge of the element) as indicated by the arrows 2000 in FIG. 12(*a*).

That is why even though the electric field overconcentration at the terminal edge of the semiconductor element 1000 can be certainly reduced by arranging the ring regions 1030*f* in the terminal region 1000*f*, electric field overconcentration still arises locally at each ring region 1030*f*, thus possibly preventing the semiconductor element 1000 from having the intended breakdown voltage.

Meanwhile, Patent Documents Nos. 4 and 5, for example, disclose that each ring is comprised of two layers with mutually different concentrations. In the terminal structures disclosed in those patent documents, each ring is designed so as to have its concentration varied both in the depth direction and in the direction that is parallel to the surface of the substrate. That is why to ensure the intended breakdown voltage using such a structure, the interval between those rings should be sufficiently broad, which could possibly increase the area of the terminal region of the power element.

Thus, to overcome such a problem, the present inventors carried out extensive researches to find a terminal structure that would minimize such a decrease in the breakdown voltage of the semiconductor element, thus perfecting our invention.

Hereinafter, embodiments of a semiconductor element according to the present invention will be described with reference to the accompanying drawings.

FIG. 1(a) is a plan view generally illustrating a semiconductor element 100 according to this embodiment and FIG. 1(b) is a cross-sectional view illustrating the terminal region 100f of the semiconductor element 100.

This semiconductor element 100 is mostly made of a silicon carbide (SiC) semiconductor. The semiconductor element 100 includes a semiconductor substrate 101 and a first silicon carbide semiconductor layer 102 which has been deposited on the semiconductor substrate 101. As shown in FIG. 1(a), as viewed along a normal to the principal surface of the semiconductor substrate 101, the semiconductor element 100 has a unit cell region 100ul with an element function (which may be a switching function in the case of a transistor or a rectifying function in the case of a diode) and a terminal region 100f which complements the breakdown voltage of the region with the element function. In forming MISFETs, source and gate electrodes of unit cells (to be described later) are connected in parallel with each other and gate pads to supply an electrical signal to the semiconductor element 1000 and a source pad to make current flow through the semiconductor element 1000 are arranged (none of which are shown in FIG. 1(a)) in the unit cell region 100ul.

In the example illustrated in FIG. 1(a), the terminal region 100f is arranged so as to surround the unit cell region 100ul. However, as long as the terminal region 100f is arranged at least locally between the unit cell region 100ul and the edge (i.e., chip edge) of the semiconductor element 100, the breakdown voltage in the vicinity of that terminal region 100f can be complemented. Also, in a situation where the terminal region 100f is arranged along the four sides of a rectangular unit cell region 100ul, even if the terminal region 100f on the respective sides discontinues at the corners of the unit cell region 100ul but if the corners are connected with a depletion layer produced in the terminal region 100f, the breakdown voltage of the overall semiconductor element 100 can still be maintained effectively.

The semiconductor substrate 101 may be an n$^+$-type silicon carbide substrate (with an impurity concentration of $1 \times 10^{19}$ cm$^{-3}$, for example). The first silicon carbide semiconductor layer 102 includes an n$^-$-type drift region 102d (with an n-type impurity concentration of about $1 \times 10^{16}$ cm$^{-3}$ and a thickness of 10 µm, for example).

As shown in FIG. 1(b), in the terminal region 100f, the first silicon carbide semiconductor layer 102 includes the drift region 102d and a number of p-type ring regions 103f which are arranged at intervals in the drift region 102d. In the example illustrated in FIG. 1(b), four ring regions 103f are arranged in the terminal region 100f. However, the number of the ring regions 103f to provide is not particularly limited. Each of those ring regions 103f is comprised of a high concentration ring region 103af and a low concentration ring region 103bf having a lower p-type impurity concentration than the high concentration ring region 103af. The high concentration ring region 103af contacts with the surface of the first silicon carbide semiconductor layer 102. Also, the side surface of the high concentration ring region 103af contacts with the drift region 102d. The low concentration ring region 103bf is located deeper than the high concentration ring region 103af and its bottom contacts with the first silicon carbide semiconductor layer 102 (i.e., with the drift region 102d in this case). Furthermore, when viewed along a normal to the surface of the semiconductor substrate 101, the high concentration and low concentration ring regions 103af and 103bf are identical in contour.

It should be noted that as long as at least one ring region 103f with such a structure is provided, another ring region with a different structure may also be provided in the terminal region 100f. In the example illustrated in FIG. 1(b), each of those ring regions 103f has a ring-like continuous region. However, the ring region 103f does not have to be such a ringlike region but may also have a structure in which multiple discrete regions are arranged either in a ring or in line. In that case, the interval between those regions is suitably set to be narrow enough to link together the depletion layers that extend from the respective regions because the intended breakdown voltage can be ensured more securely in that case.

Hereinafter, an exemplary ion implantation profile in the depth direction for the ring region 103f will be described. In this embodiment, the ring region 103f is formed by ion implantation. FIG. 2 shows an ion implantation profile in the depth direction for the ring region 103f shown in FIG. 1(b). In this description, the "depth direction" refers to the direction that is defined by a normal to the principal surface of the semiconductor substrate 101 (i.e., the direction indicated by the line A-B shown in FIG. 1(b)).

Strictly speaking, an impurity concentration profile is different from an ion implantation profile. In many cases, the impurity concentration often becomes lower than the concentration of impurity ions implanted because the percentage of activation of the impurity ions implanted is variable. If the percentage of activation is 100%, the ion implantation profile and the impurity concentration profile become substantially the same. For example, if the percentage of activation is supposed to be α%, the ion implant dose may be multiplied by 1/(α/100) so as to obtain the impurity concentration designed.

In this embodiment, Al may be selected as the implanted species, for example. In SiC, the diffusion coefficient of Al in silicon carbide is so small that the variation in concentration profile due to diffusion is almost negligible. On the other hand, if B (boron) is used as an impurity to be introduced into the body region 103, the ion implantation energy and implant dose are suitably selected so as to obtain an intended impurity concentration profile with the percentage of activation and the diffusion coefficient taken into account in advance. In the following description, the percentage of activation is supposed to be 100% and the impurity concentration profile and the ion implantation profile are supposed to be substantially the same. That is to say, in the following description, the profile shown in FIG. 2 is supposed to represent the impurity concentration profile in the depth direction of the ring region 103f (including the high concentration ring region 103af and the low concentration ring region 103bf).

The high concentration ring region 103af and the low concentration ring region 103bf may be formed by performing an ion implantation process in multiple steps with the implantation energy changed. The profile of impurity ions to be implanted in each ion implantation process step has a peak and a tail. In this description, the "peak" refers to a local maximum value of the concentration in the ion implantation range Rp, and the "tail" refers to a portion where the concentration decreases in the depth direction from that local maximum value. The ion implantation profile shown in FIG. 2 may be the sum of the profiles obtained through four ion implantation process steps, for example. Those ion implantation process steps may be carried out with the implantation energies and implant doses set to be:

30 keV and $3.0 \times 10^{13}$ cm$^{-2}$,
70 keV and $6.0 \times 10^{13}$ cm$^{-2}$,
150 keV and $1.5 \times 10^{14}$ cm$^{-2}$, and
350 keV and $4.0 \times 10^{13}$ cm$^{-2}$, respectively.

In that case, as indicated by the solid line in FIG. 2, a portion of the first silicon carbide semiconductor layer 102 of which the depth as measured from its upper surface is smaller than that of the boundary (which may be 0.3 µm, for example)

is the high concentration ring region 103*af*, while another portion of the first silicon carbide semiconductor layer 102 which is deeper than the boundary is the low concentration ring region 103*bf*. If the percentage of activation is supposed to be 100% as described above, the impurity concentrations of the high concentration and low concentration ring regions 103*af* and 103*bf* may be about $1\times10^{19}$ cm$^{-3}$ and about $2\times10^{18}$ cm$^{-3}$, respectively, at maximum. Supposing the percentage of activation is 100%, these values become the maximum impurity concentrations of the high concentration and low concentration ring regions 103*af* and 103*bf*. Also, the high concentration and low concentration ring regions 103*af* and 103*bf* may have average impurity concentrations of about $9.7\times10^{18}$ cm$^{-3}$ and about $1.5\times10^{18}$ cm$^{-3}$, respectively. As measured along a normal to the principal surface of the semiconductor substrate 101, the thicknesses (depths) of the high concentration and low concentration ring regions 103*af* and 103*bf* may be approximately 300 nm each.

In this description, the average impurity concentration of the high concentration ring region 103*af* is defined herein to be the average value of a region that has an impurity concentration of $2\times10^{18}$ cm$^{-3}$ or more. On the other hand, the average impurity concentration of the low concentration ring region 103*bf* is defined herein to be the average value of a region that has an impurity concentration of $5\times10^{17}$ cm$^{-3}$ to less than $2\times10^{18}$ cm$^{-3}$. Although the average impurity concentrations according to this embodiment are defined to be "$2\times10^{18}$ cm$^{-3}$ or more" and "$5\times10^{17}$ cm$^{-3}$ or more", respectively, in order to indicate their suitable value clearly, these values may also be changed depending on the type of the element to design. In that case, the average impurity concentration of the high concentration ring region 103*af* is suitably twice to one hundred times as high as that of the low concentration ring region 103*bf*. It should be noted that the reference impurity concentrations of "$2\times10^{18}$ cm$^{-3}$ or more" and "$5\times10^{17}$ cm$^{-3}$ or more" according to this embodiment are based on the impurity concentration Cs in the vicinity of the boundary between the high concentration ring region 103*af* and the low concentration ring region 103*bf*. More specifically, the regions, of which the average impurity concentrations need to be calculated, are determined so that their average impurity concentrations become Cs×2 or more and Cs/2 or more, respectively, with Cs defined to be equal to $1\times10^{18}$ cm$^{-3}$.

In the example shown in FIG. 2, the concentration profile includes a first range which is substantially flat and a second range which is deeper, and has a lower concentration, than the first range. The high concentration ring region 103*af* covers the first range and the low concentration ring region 103*bf* covers the second range. It should be noted that the concentration profile does not have to be the illustrated one but its shape may vary according to the ion implantation process condition or the number of implantation process steps carried out.

The thicknesses (as measured along a normal to the principal surface of the semiconductor substrate 101) of the respective ring regions 103*af* and 103*bf* do not have to be the exemplary values described above. However, it is recommended that the thickness of the high concentration ring region 103*af* be 15 nm or more and that the thickness of the low concentration ring region 103*bf* be 100 nm or more. In that case, the overconcentration of an electric field that would otherwise be produced around the bottom corners of the ring region 103 can be reduced more securely and a depletion layer which links adjacent ring regions 103*af* together can be formed with more certainty.

Now look at FIG. 1 again. The semiconductor element 100 may further include a diode region 115*d* between the unit cell region 100*ul* and the terminal region 100*f*. In the example illustrated in FIG. 1(*a*), the diode region 115*d* is arranged in a ring so as to surround the unit cell region 100*ul*. Alternatively, the diode region 115*d* may be arranged discretely between the unit cell region 100*ul* and the terminal region 100*f*. Still alternatively, the diode region 115*d* may also be arranged only locally around the unit cell region 100*ul*.

As shown in FIG. 1(*b*), a region of the second conductivity type (e.g., p-type region in this example) 103*d*, comprised of a high concentration region 103*ad* and a low concentration region 103*bd*, is arranged in this embodiment in the diode region 115*d* of the first silicon carbide semiconductor layer 102. The region of the second conductivity type 103*d* and the drift region 102*d* form a pn junction diode. The respective regions 103*ad* and 103*bd* have the same concentration profiles as the high concentration ring region 103*af* and the low concentration ring region 103*bf*, respectively. That is to say, the high concentration region 103*ad* contacts with the surface of the first silicon carbide semiconductor layer 102. The low concentration region 103*bd* is located deeper, and has a lower impurity concentration, than the high concentration region 103*ad* and its bottom contacts with the drift region 102*d*. Also, at least a part of the side surface of the low concentration region 103*bd* and high concentration region 103*ad* which faces the ring region 103*f* suitably contacts with the drift region 102*d*.

Although not shown, the region of the second conductivity type 103*d* is electrically connected to an electrode layer (which may be a source electrode layer, for example) which is arranged over the first silicon carbide semiconductor layer 102. In this respect, the region of the second conductivity type 103*d* is different from the ring region 103*f* of the same conductivity type.

When viewed along a normal to the principal surface of the semiconductor substrate 101, the region of the second conductivity type 103*d* may be arranged outside of a unit cell that defines the periphery of the unit cell region 100*ul* (which will be referred to herein as a "peripheral cell") and may be separated from the peripheral cell by the drift region 102*d*. Alternatively, a part of the body region 103 of the peripheral cell (which may be located closer to the terminal region 100*f*) may be used as the region of the second conductivity type 103*d*. In that case, no impurity region (source region) 104 may be defined in that part of the body region 103 to be used as the region of the second conductivity type 103*d* but an impurity region 104 may be defined only in a part of the body region 103 functioning as a unit cell.

On the back surface of the semiconductor substrate 101 (which is opposite to its principal surface with the first silicon carbide semiconductor layer 102), arranged is an ohmic electrode (which will be referred to herein as a "second ohmic electrode") 110. The second ohmic electrode 110 functions as a drain electrode, for example, in the unit cell region 100*ul*. If a potential of zero volts is applied to the region of the second conductivity type 103*ad* and if a positive voltage is applied to the drain electrode 110, a reverse bias is applied to the pn junction formed between the low concentration region 103*bd* and the drift region 102*d*.

Next, the breakdown voltage increasing effect achieved by the terminal structure of this embodiment will be described in comparison with the traditional structure.

A structure in which twenty ring regions 103*f* were arranged at intervals of approximately 1 to 4 µm in the terminal region 100*f* was used as a sample representing a specific example of the present invention. And the breakdown voltage was calculated based on the intensity of an electric field of such a structure. It should be noted that the side surface of each ring region 103f was supposed to be substantially perpendicular to the surface of the semiconductor substrate 101. Also, each ring region 103f was supposed to have a width (i.e., the maximum width of the ring region 103f as measured on the upper surface) of 1 µm and a depth of 0.6 µm. The impurity concentration profile of the ring region 103f was supposed to be the same as the profile shown in FIG. 2. And the region of the second conductivity type 103d arranged in the diode region 115d was supposed to have the same concentration distribution and the same depth as the ring regions 103f. In this example, the breakdown voltage turned out to be 865 V.

For the purpose of comparison, the breakdown voltage of the traditional semiconductor element 1000 (see FIG. 12) in the ring regions 1030f was calculated. In the comparative example, the ring regions 1030f were supposed to have a constant concentration in the depth direction and have a depth of 0.6 µm. The number, interval and width of the ring regions 1030f were supposed to be the same as those of the ring regions 1030f of the specific example of the present invention. The p-type region 1030d was supposed to have the same concentration distribution and the same depth as the ring regions 1030f. In the comparative example, when the ring regions 1030f had an average impurity concentration of $2 \times 10^{18}$ cm$^{-3}$, the breakdown voltage was 852 V. The breakdown voltages were also calculated in the same way with the impurity concentration of the ring regions 1030f increased. For example, when the impurity concentrations were $5 \times 10^{18}$ cm$^{-3}$, $1 \times 10^{19}$ cm$^{-3}$ and $2 \times 10^{19}$ cm$^{-3}$, the breakdown voltages were 804 V, 794 V and 772 V, respectively. These results of calculation reveal that in the comparative example, if the drift region 1020d had a constant impurity concentration and a constant thickness, the higher the concentration in the ring regions 1030f, the smaller the breakdown voltages in the diode region 1150d and terminal region 1000f.

As can be seen from these results, no matter whether the impurity concentration in the ring regions 1030f was set to be low (e.g., as low as the impurity concentration in the low concentration ring region 103bf of the specific example of the present invention) or high (e.g., as high as the impurity concentration in the high concentration ring region 103af of the specific example of the present invention), the breakdown voltages achieved were less high in the comparative example than in the specific example of the present invention. Thus, the present inventors confirmed that the decrease in breakdown voltage could be much less significant according to the specific example of the present invention than in the comparative example.

The reason is probably as follows. Specifically, if the concentration in the ring regions 1030f of the comparative example is set to be $2 \times 10^{18}$ cm$^{-3}$, for example, then the electric field will be overconcentrated at the corners of the ring regions 1030f (as indicated by the arrows 2000 shown in FIG. 12), thus determining the breakdown voltage. On the other hand, since the impurity concentration is higher according to the specific example of the present invention in the upper part of the ring regions 103f than at the corners, then electric field applied to the respective corners of the ring regions 103f is weakened parallel to the surface of the substrate. As a result, the overconcentration of the electric field around the corner portions can be reduced and the decrease in breakdown voltage due to the presence of a pn junction can be minimized in the diode region 115d and the terminal region 100f.

On the other hand, if the concentration in the ring regions 1030f of the comparative example is increased to $2 \times 10^{19}$ cm$^{-3}$, for example, the breakdown voltage will be 772 V. That is to say, it can be seen that the decrease in breakdown voltage cannot be minimized simply by increasing the concentration in the ring regions 1030f. Rather an increase in the concentration in the ring regions 1030f would further decrease the breakdown voltage. This is probably because an even higher electric field should be applied to the corners of the ring regions 1030f. On the other hand, by setting the concentration in the bottom part of each ring region 103f to be lower than the concentration in the upper part thereof as is done in the specific example of the present invention, the breakdown voltage achieved can be higher than in a situation where the concentration is set to be low in the entire ring region and in a situation where the concentration is set to be high in the entire ring region.

Such an effect of minimizing the decrease in breakdown voltage can be achieved as long as the high concentration ring region 103af has a higher impurity concentration than the low concentration ring region 103bf. However, the concentration in the high concentration ring region 103af is suitably twice or more as high as in the low concentration ring region 103bf. Then, the decrease in breakdown voltage can be minimized even more effectively.

Also, a side surface of the high concentration ring regions 103af of this embodiment contacts directly with the drift region 102d as shown in FIG. 1(b). And suitably the entire side surface of the high concentration ring region 103af contacts with the drift region 102d. With such a configuration, the interval between adjacent ring regions 103f can be further reduced. The higher the concentration at the side surface of the ring regions 103f is, the thicker the depletion layer that expands from the side surface parallel to the substrate becomes. As a result, even if the interval between adjacent ring regions 103f is decreased, the depletion layers can still be linked together and the intended breakdown voltage can be achieved more securely. Basically, the terminal region 100f that complements the breakdown voltage of the element function does not contribute to electrical conduction when the MISFET is in ON state. That is why as long as the intended breakdown voltage can be achieved, the area of the terminal region 100f (as viewed along a normal to the principal surface of the semiconductor substrate 101) is suitably as small as possible. By reducing the area of the terminal region 100f, the chip area of the semiconductor element 100 can be reduced and the cost of the semiconductor element 100 can be cut down significantly.

Next, it will be described specifically how the terminal structure described above may be applied to a MISFET.

Figure 3:
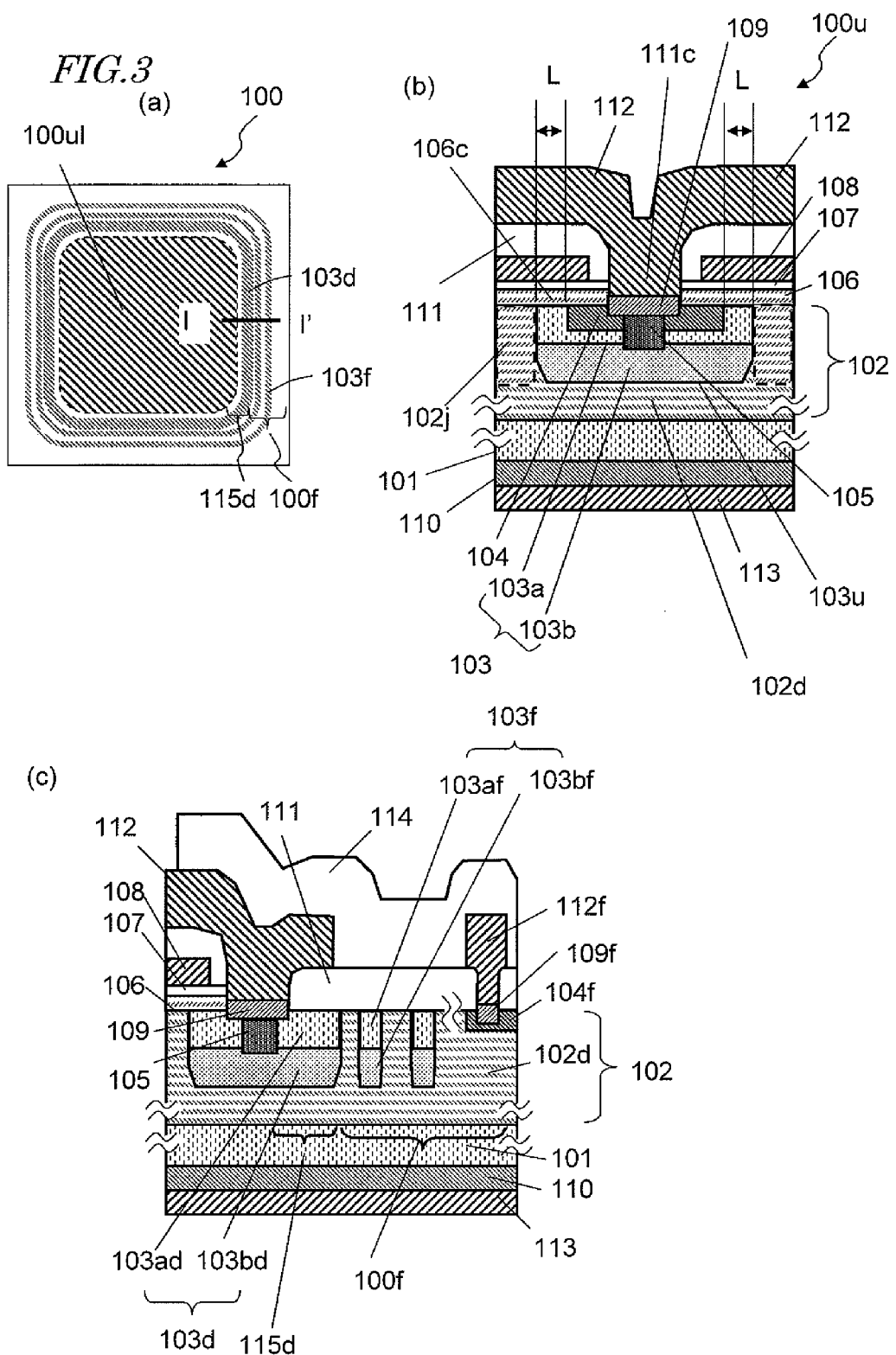
FIG. 3 Illustrates an example in which the semiconductor element 100 is implemented as a MISFET, wherein (a) is a plan view of the semiconductor element 100, (b) is a cross-sectional view of a unit cell 100*u* of the semiconductor element 100, and (c) is a cross-sectional view illustrating the terminal structure of the semiconductor element 100.

FIG. 3 illustrates an example of a semiconductor element 100 according to this embodiment. The semiconductor element 100 shown in FIG. 3 is a vertical MISFET. FIG. 3(a) is a top view of the semiconductor element 100 just like FIG. 1(a), and its description will be omitted herein. In the unit cell region 100ul of the semiconductor element 100, a plurality of unit cells 100n are arranged two-dimensionally. FIG. 3(b) is a schematic cross-sectional view of each unit cell 100u of the semiconductor element 100 according to this embodiment. FIG. 3(c) is a schematic cross-sectional view illustrating the terminal region 100f and diode region 115d of the semiconductor element 100.

The semiconductor element 100 includes a semiconductor substrate 101 of a first conductivity type and a first silicon carbide semiconductor layer (drift layer) 102 which has been formed on the principal surface of the substrate 101. In this embodiment, the first conductivity type is n type and the second conductivity type is p type. But the first and second conductivity types may also be p and n types, respectively.

The semiconductor substrate 101 has n$^+$ conductivity and is made of silicon carbide. The first silicon carbide semiconductor layer 102 is of n$^-$ type and has the drift region 102d. It should be noted that the superscript "+" or "−" added to the conductivity type "n" or represents the relative concentration of the impurity introduced. That is to say, "n$^+$" means that the concentration of an n-type impurity added is higher than "n", while "n$^-$" means that the concentration of an n-type impurity added is lower than "n".

First of all, the configuration of the unit cell 100u will be described with reference to FIG. 3(b).

In the first silicon carbide semiconductor layer 102, a body region 103 of the second conductivity type is arranged adjacent to the drift region 102d. In this example, the rest of the first silicon carbide semiconductor layer 102 other than the body region 103 is the drift region 102d. The body region 103 includes a first body region 103a of the second conductivity type and a second body region 103b of the second conductivity type. The first body region 103a contacts with the surface of the first silicon carbide semiconductor layer 102 and the bottom of the second body region 103b contacts with the first silicon carbide semiconductor layer 102 (i.e., the drift region 102d in this example). As measured perpendicularly to the principal surface of the semiconductor substrate 101, the first and second body regions 103a and 103b have thicknesses of at least 15 nm and at least 100 nm, respectively. In the example illustrated in FIG. 3(b), the body region 103 is comprised of the first and second body regions 103a and 103b and has a thickness (depth) of at least 115 nm (=15 nm+100 nm) combined. In this embodiment, the first body region 103a is of p$^+$ type and the second body region 103b is of p-type. As will be described in detail later, it is beneficial if the average impurity concentration of the first body region 103a is twice or more as high as that of the second body region 103b.

The body region 103 is formed by introducing an impurity of the second conductivity type into the first silicon carbide semiconductor layer 102 of the first conductivity type. That is why the body region 103 includes both an impurity of the first conductivity type and the impurity of the second conductivity type and is defined to be a region in which the concentration of the impurity of the second conductivity type is higher than that of the impurity of the first conductivity type. At the bottom 103u of the body region 103, the concentration of the impurity of the first conductivity type in a part of the first silicon carbide semiconductor layer 102 that contacts with the body region 103 is as high as that of the impurity of the second conductivity type in the second body region 103b. Also, when viewed perpendicularly to the principal surface of the semiconductor substrate 101, the contours of the first and second body regions 103a and 103b match with each other.

An impurity region 104 of the first conductivity type is provided in the body region 103. More specifically, the impurity region 104 is arranged in the first body region 103a so as to contact with the surface 102 of the first silicon carbide semiconductor layer 102. The impurity region 104 is of n$^+$ type.

A contact region 105 of the second conductivity type is suitably provided in the first body region 103a and may be of p$^+$ type. The contact region 105 contacts with at least the first body region 103a and suitably contacts with the second body region 103b, too. A first ohmic electrode 109 has been formed over the impurity region 104. The first ohmic electrode 109 covers the respective surfaces of, and is electrically in contact with, both of the impurity region 104 and the contact region 105. If the first body region 103a has a sufficiently high impurity concentration, then the contact region 105 may be omitted. In that case, a contact trench may be cut so as to expose the first body region 103a and be filled with the first ohmic electrode 109, thereby making the first body region 103a and the first ohmic electrode 109 contact directly with each other.

A portion 102j of the drift region 102d which is adjacent to the body region 103 (i.e., the region 102j interposed between the respective body regions 103 of two adjacent unit cells) will be referred to herein as a JFET (junction field-effect transistor) region for the sake of simplicity of description. This region forms part of the drift region 102d of the first silicon carbide semiconductor layer 102. The impurity concentration of the JFET region 102j may be the same as that of the rest of the drift region 102d other than the JFET region 102j. However, in order to reduce the resistance in the JFET region 102j, the JFET region 102j may have a higher impurity concentration than the rest of the drift region 102d. Such a JFET region 102j may be formed by introducing an impurity of the first conductivity type (which is n-type in this example) into a predetermined portion of the drift region 102d by ion implantation, for example. If the rest of the drift region 102d other than the JFET region 102j has an impurity concentration of about $5 \times 10^{15}$ cm$^{-3}$, the JFET region 102j may have a concentration of $1 \times 10^{17}$ cm$^{-3}$, for example.

On the first silicon carbide semiconductor layer 102, arranged is a second silicon carbide semiconductor layer 106 of the first conductivity type, which contacts at least partially with the body region 103 and the impurity region 104. It will be more beneficial if the second silicon carbide semiconductor layer 106 is electrically connected to the impurity region 104 and the drift region 102d (i.e., the JFET region 102j) and is located over the first body region 103a.

In this embodiment, the second silicon carbide semiconductor layer 106 has been grown epitaxially. The second silicon carbide semiconductor layer 106 has a channel region 1060 in its portion that contacts with the first body region 103a. The length of the channel region 106c (which will be referred to herein as a "channel length L") is as indicated by each of the two double-headed arrows shown in FIG. 3(b). That is to say, the "channel length" of the MISFET is defined by a horizontal size measured on the upper surface of the first body region 103a (i.e., the surface that contacts with the second silicon carbide semiconductor layer 106) on the paper.

A gate insulating film 107 has been formed on the second silicon carbide semiconductor layer 106. A gate electrode 108 is arranged on the gate insulating film 107. The gate electrode 108 is located over the channel region 106c to say the least. Optionally, the second silicon carbide semiconductor layer 106 may be omitted and the gate insulating film 107 may be arranged so as to contact with the first silicon carbide semiconductor layer 102. In that case, a channel (i.e., an inversion channel layer) is formed on the surface of the first body region 103a.

An interlevel dielectric film 111 has been deposited over the gate electrode 108, and an upper interconnect electrode 112 is stacked on the interlevel dielectric film 111. The upper interconnect electrode 112 is connected to the first ohmic electrode 109 through a contact hole 111c that has been cut through the interlevel dielectric film 111. On the back surface of the semiconductor substrate 101, arranged is a second ohmic electrode 110. And a back surface interconnect electrode 113 may be further stacked on the second ohmic electrode 110.

Figure 4:
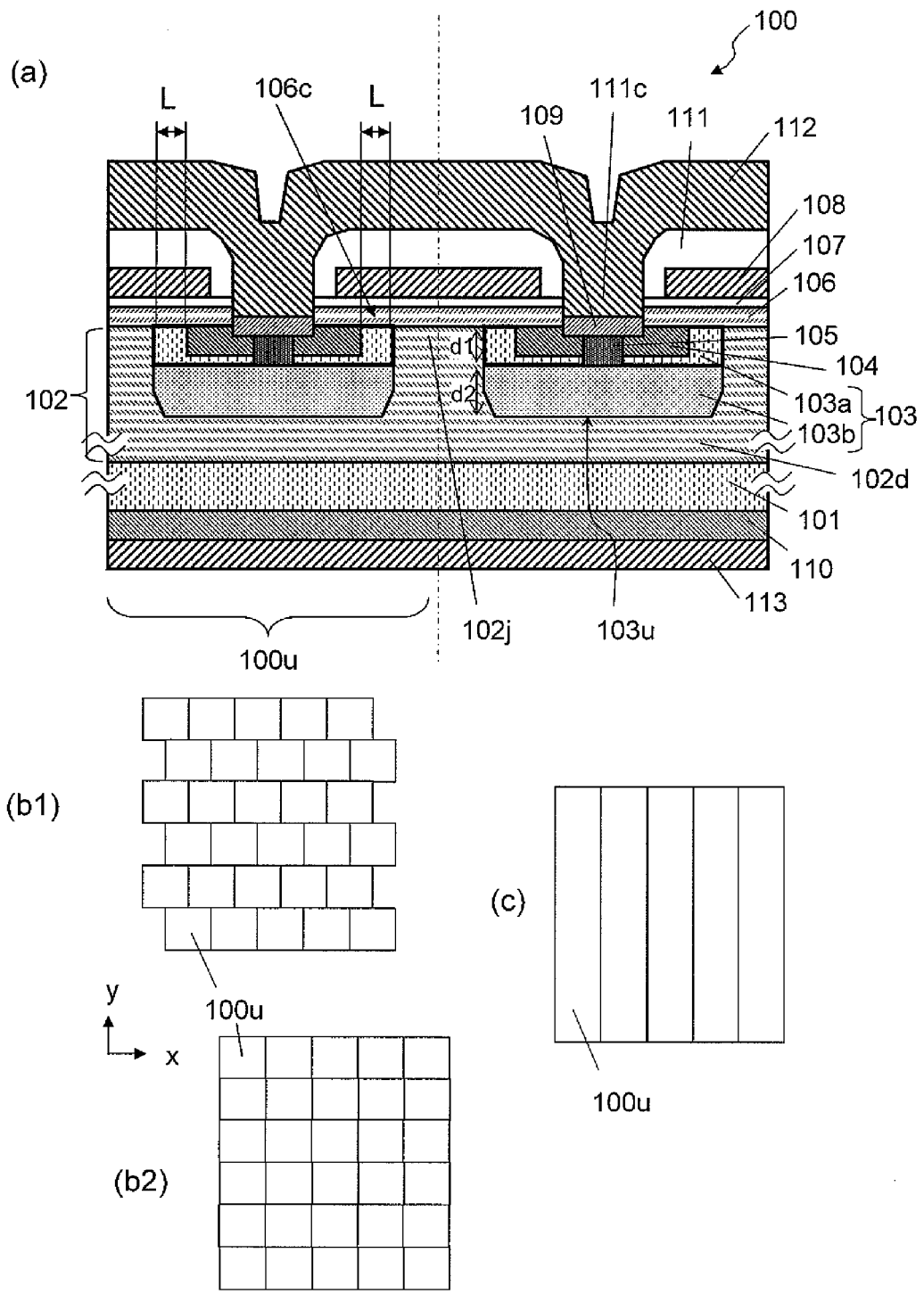
FIG. 4 Illustrates the arrangement of the unit cells 100*u*, wherein (a) is a cross-sectional view illustrating two adjacent unit cells 100*u*, (b1) and (b2) are plan views, each illustrating an exemplary arrangement of multiple rectangular unit cells 100*u*, and (c) is a plan view illustrating an exemplary arrangement of multiple striped unit cells.

When the semiconductor element 100 is viewed from over the upper interconnect electrode 112, each unit cell 100u of the semiconductor element 100 may have a square shape, for example. Alternatively, the unit cell 100u may also have a rectangular shape, a quadrilateral shape or any other polygonal shape as well. FIG. 4(a) illustrates a cross-sectional structure in a situation where unit cells 100u are arranged in parallel. As shown in FIG. 4(b1), the unit cells 100u may be arranged two-dimensionally in x and y directions, and rows of unit cells may shift alternately by a half pitch in the y direction. Or the unit cells 100u may also be arranged regularly as shown in FIG. 4(b2). If the unit cells 100u have a shape that is elongated in one direction, then the unit cells 100u may also be arranged in parallel as shown in FIG. 4(c). The unit cell region 100ul of the semiconductor element is formed by a number of unit cells 100u that are arranged in this manner.

As shown in FIG. 3(c), the terminal region 100f and the diode region 115d are arranged around the unit cell region 100ul. These regions have the same basic configuration as their counterparts shown in FIG. 1(b). But their configurations are illustrated more specifically in FIG. 3(c). In FIG. 3(c), any component also shown in FIG. 1(b) is identified by the same reference numeral and a detailed description thereof will be omitted herein to avoid redundancies.

In the diode region 115d, arranged is the region of the second conductivity type 103d including the high concentration region 103ad of the second conductivity type and the low concentration region 103bd of the second conductivity type. And the contact region 105 of the second conductivity type is further arranged in the region of the second conductivity type 103d. The contact region 105 is electrically connected to at least the high concentration region 103ad. In the example illustrated in FIG. 3(c), the high and low concentration regions 103ad and 103bd of the second conductivity type have substantially identical impurity concentration profile in the depth direction as the first and second body regions 103a and 103b, respectively. The first ohmic electrode 109 contacts with the high concentration region 103ad and the contact region 105 in the region of the second conductivity type 103d. As described above, if the impurity concentration of the high concentration region 103ad is sufficiently high, the contact region 105 is not necessarily provided. In that case, by cutting a contact trench through the high concentration region 103ad and filling the trench with the first ohmic electrode 109, the first ohmic electrode 109 may be brought into direct contact with the high concentration region 103ad. Also, the second silicon carbide semiconductor layer 106, the gate insulating film 107, and the gate electrode 108 which have been formed in the unit cell region 100ul may be extended to a portion of the diode region 115d. However, as the source region is not arranged in the region of the second conductivity type 103d, no channel is formed there. Optionally, only a portion of the body region 103 of the peripheral cell which is located closer to the terminal region 100f may function as the region of the second conductivity type 103d. In that case, the source region 104 is arranged only in a portion of body region 103 of the peripheral cell which is located closer to the unit cell region 100ul.

The region of the second conductivity type 103d contacts with the first ohmic electrode 109 in the hole that has been cut through the interlevel dielectric film 111. The first ohmic electrode 109 is connected to the upper interconnect electrode 112. Thus, the region of the second conductivity type 103d is electrically connected in parallel to the unit cell region 100ul via the upper interconnect electrode 112.

The diode region 115d is suitably formed by using the structure of each unit cell 100u in the unit cell region 100ul. The diode region 115d may have the same structure as the unit cell 100u except that the diode region 115d does not have the second silicon carbide semiconductor layer 106 or the impurity region 104. That is to say, a portion of the unit cell 100u corresponding to the body region 103 becomes the region of the second conductivity type 103d. Also, if the entire surface region of the first silicon carbide semiconductor layer 102 in the unit cell region 100ul is covered with a p-type layer as in a MISFET with a trench structure, for example, then the p-type layer arranged in the unit cell region 100ul may be extended to the diode region 115d to define the region of the second conductivity type 103d.

The thicknesses of the respective regions 103ad and 103bd of the region of the second conductivity type 103d are not particularly limited. But the high concentration region 103ad suitably has a thickness of 15 nm or more and the low concentration region 103bd suitably has a thickness of 100 nm or more. Then, the overconcentration of an electric field to be produced around the bottom corners of the region of the second conductivity type 103d can be reduced more securely. The ring region 103f (more specifically, the high concentration ring region 103af) is covered with the interlevel dielectric film 111. At a chip edge of this semiconductor element 100, a stopper region 104f of the first conductivity type which prevents a depletion layer produced by a pn junction from reaching the chip edge, the upper interconnect 112f, and a contact electrode 109f which electrically connects the stopper region 104f and the upper interconnect 112f together may be arranged. The upper interconnect 112f and the contact electrode 109f are arranged to fill the holes of the interlevel dielectric film 111. The upper interconnect electrode 112 and the upper interconnect 112f do not directly contact with each other. The upper interconnect electrode 112 and the upper interconnect 112f may be made of the same conductor film. The stopper region 104f may be an n$^+$-type region having identical impurity concentration as the source region 104.

A passivation film 114 is provided so as to cover the upper interconnect 112f entirely and the upper interconnect electrode 112 partially. The passivation film 114 may cover the unit cell 100u on the unit cell region 100ul at least partially. Also, as in the unit cell region 100ul, the back surface interconnect electrode 113 may be arranged on the second ohmic electrode 110.

Hereinafter, it will be described with reference to FIGS. 5 through 9 exactly how to fabricate the semiconductor element 100 of this embodiment. In each of FIGS. 5 through 9, portions (a1) through (a3) are cross-sectional views illustrating respective process steps to be performed on the unit cell region 100ul, and portions (IA) through (b3) are cross-sectional views illustrating respective process steps that are to be performed on the terminal region 100f and that correspond to the processing steps illustrated in portions (a1) through (a3), respectively.

First of all, a semiconductor substrate 101 is provided. The semiconductor substrate 101 may be a low-resistance n-type 4H—SiC off-axis cut substrate (with a resistivity of 0.02 Ωcm), for example.

Figure 5:
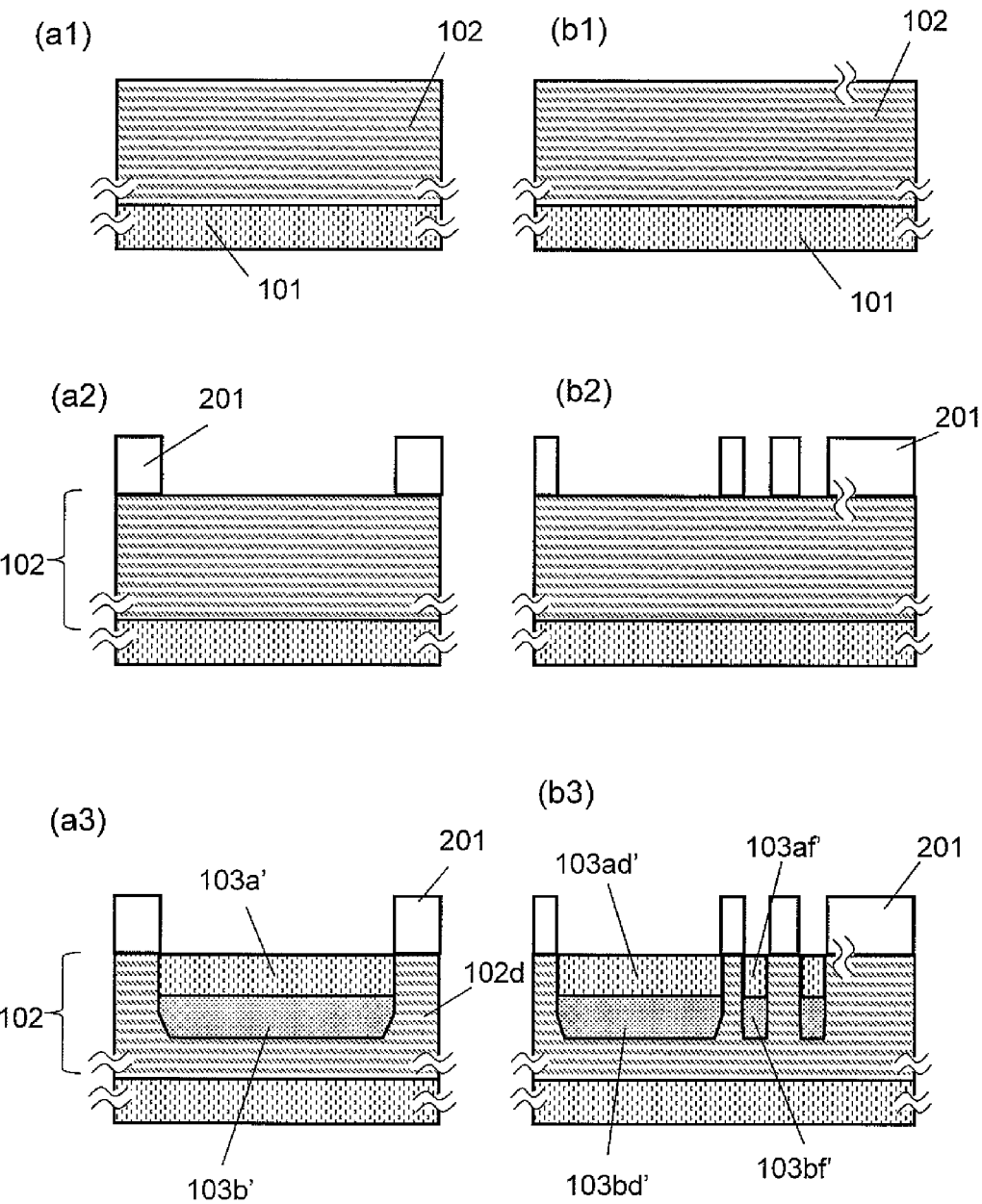
FIG. 5 Cross-sectional views illustrating respective manufacturing process steps to fabricate the semiconductor element 100, wherein (a1) through (a3) illustrate its unit cell region and (b1) through (b3) illustrate its diode region and terminal region.

As shown in FIGS. 5(a1) and 5(b1), a first silicon carbide semiconductor layer 102 with high resistance is grown epitaxially on the semiconductor substrate 101. Before the first silicon carbide semiconductor layer 102 is formed, a buffer layer made of SiC with a high impurity concentration may be deposited on the semiconductor substrate 101. Illustration of the buffer layer is omitted herein for the sake of simplicity. The buffer layer may have an impurity concentration of $1 \times 10^{18}$ cm$^{-3}$ and a thickness of 1 μm, for example. The first silicon carbide semiconductor layer 102 may be made of n-type 4H—SiC and may have an impurity concentration of $1 \times 10^{16}$ cm$^{-3}$ and a thickness of 10 μm, for example.

Thereafter, as shown in FIGS. 5(a2) and 5(b2), the first silicon carbide semiconductor layer 102 is partially covered with a mask 201 of SiO$_2$, for example. Subsequently, as shown in FIGS. 5(a3) and 5(b3), ions of Al are implanted into portions of the first silicon carbide semiconductor layer 102 to be a body region, a diode region and ring regions. In this manner, in the unit cell region 100ul, a first body implanted region 103a' is formed as a high concentration region in a shallow region of the first silicon carbide semiconductor layer 102 and a second body implanted region 103b' is formed so as to be located deeper and contain the ions at lower concentration than the first body implanted region 103a'. In the terminal region 100f, on the other hand, a high concentration implanted ring region 103af' and a low concentration implanted ring region 103bf' that will form the ring region 103f later and a high concentration implanted region 103ad' and a low concentration implanted region 103bd' that will form the region of the second conductivity type 103d later are defined at the same time. Consequently, a ring region that can minimize a decrease in breakdown voltage in the terminal region 100f can be formed as described above. In addition, by carrying out the ion implantation to define those ring regions and the ion implantation to define those body regions at the same time, the process can be simplified, too.

When the ions implanted are activated, the first and second body implanted regions 103a' and 103b' will be first and second body regions 103a and 103b, respectively. Meanwhile, the rest of the first silicon carbide semiconductor layer 102', other than the first and second body regions 103a and 103b, will define a drift region 102. In this process step, the implantation profile of the body region 103 may be the same as the one shown in FIG. 2, for example.

In this embodiment, the regions 103a', 103ad' and 103af' having high impurity concentration and regions 103b', 103bd' and 103bf' having low impurity concentration formed by using the same mask 201. Consequently, the process can be simplified in this respect, too. In this case, as viewed along a normal to the principal surface of the semiconductor substrate 101, the regions having high impurity concentration and the regions having low impurity concentration come to have substantially matching contours because those two groups of regions have been formed using the same mask 201. As a result, the interval between the body regions 103 of two adjacent unit cells can be reduced to a sufficiently small value. For example, the interval between the body regions 103 can be set to be the intended value (which may be 1 μm, for example). If the terminal structure includes a plurality of implanted layers in multiple different regions as in the JTE structure, it is very difficult to form the unit cell and the terminal region at the same time as accurately as is done in this embodiment. If a region having high impurity concentration and a region having low impurity concentration were formed by two different processes, the mask should be rearranged and should have its shapes changed. As a result, the interval between the body regions (which will eventually define the width of the JFET region) could not be set to be the intended value. For example, if the first and second body implanted regions 103a' and 103b' were formed by two different processes using two different masks, then the implantation might be off target parallel to the surface of the substrate. In that case, as viewed along a normal to the principal surface of the semiconductor substrate 101, the first and second body implanted regions 103a' and 103b' might have their contours shifted from each other and the JFET region might become narrower, which would lead to an increase in the ON-state resistance of the MISFET. That is why according to this embodiment, it is recommended that the first and second body implanted regions 103a' and 103b' be formed using the same mask 201. In the same way, if the high concentration implanted ring region 103af' and the low concentration implanted ring region 103bf' to be the ring region 103f later are formed using the same mask 201, then the interval between adjacent ring regions 103f can be decreased. As a result, the area allocated to the terminal region 100f can be reduced and eventually the chip area itself can be reduced. Furthermore, if the high concentration implanted region 103ad' and the low concentration implanted region 103bd' to be the region of the second conductivity type 103d eventually are formed using the same mask 201, the area allocated to the diode region 115d can be reduced.

Figure 6:
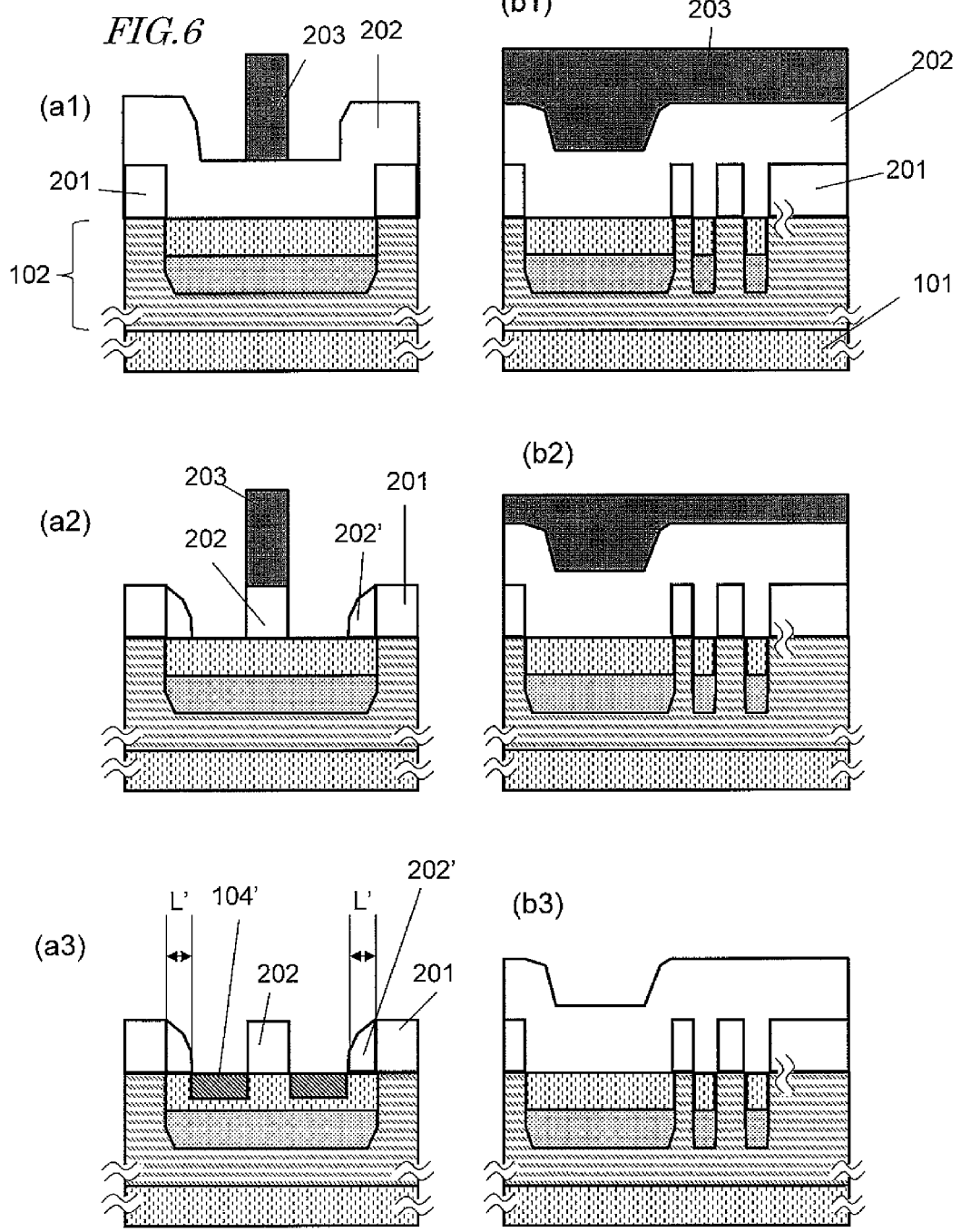
FIG. 6 Cross-sectional views illustrating respective manufacturing process steps to fabricate the semiconductor element 100, wherein (a1) through (a3) illustrate its unit cell region and (b1) through (b3) illustrate its diode region and terminal region.

Next, as shown in FIGS. 6(a1) and 6(b1), the mask 201 is entirely covered with another mask 202. Next, the photoresist is patterned so as to cover the terminal region, the diode region and a region to be the contact region, thereby making a resist mask 203. The masks 201 and 202 are suitably made of materials that can have the intended selectivity in the dry etching process. For example, the mask 201 may be made of $SiO_2$ and the mask 202 may be made of polysilicon.

Subsequently, as shown in FIGS. 6(a2) and 6(b2), the mask 202 is dry-etched using the resist mask 203 as an etching mask. As a result, in the unit cell region, only a portion of the mask 202 is left on the side surface of the mask 201 by the so-called "self-alignment process", thereby forming a sidewall 202' (see FIG. 6(a2)). In the terminal region and the diode region, on the other hand, the mask 202 is covered with the resist mask 203 and is not etched (see FIG. 6(b2)).

Thereafter, as shown in FIGS. 6(a3) and 6(b3), the resist mask 203 is removed and then portions of the first silicon carbide semiconductor layer 102 which are not covered with the masks 201 and 202 or the sidewall 202' are doped with N ions, for example, thereby forming a source implanted region 104'. If this region 104' is formed by ion implantation, the ion implantation conditions including the implant energy and the implant dose are selected so that an n-type region with an impurity concentration of about $5 \times 10^{19}$ cm$^{-3}$ is formed to have a thickness of approximately 200 to 300 nm. As a result, the source implanted region 104' is defined in the first body implanted region 103a'. In this manner, according to this embodiment, the width of a portion corresponding to the channel of a MISFET, i.e., the length L' that will eventually define the gate length L as shown in FIG. 6(a3), can be controlled precisely. The length L or L' is defined by the width of the sidewall 202' and may be approximately 0.5 μm, for example.

To set the gate length L to be the intended value in a MISFET with a channel layer, it is recommended that the source implanted region 104' and body implanted region 103' be formed accurately in the first silicon carbide semiconductor layer 102 by the self-alignment process shown in FIG. 6(a2). If the source implanted region 104' and the body implanted region 103' were formed without adopting the self-alignment process described above, then misalignment could occur even within the same unit cell and the predetermined gate length L could not be obtained. What is more, as the case may be, the gate length L could become so short due to the misalignment that the channel of the transistor could cause short circuit. To avoid such an unwanted situation, it is recommended to adopt the self-alignment process described above. Instead of adopting the self-alignment process, the gate length L may be set to be sufficiently long with the possible mask misalignment taken into account. However, if the gate length L were sufficiently long, then the channel resistance of the transistor would rise and the ON-state resistance might increase as a result. For that reason, the self-alignment process is suitably adopted to make the masks 201 and 202 to define the source region.

Figure 7:
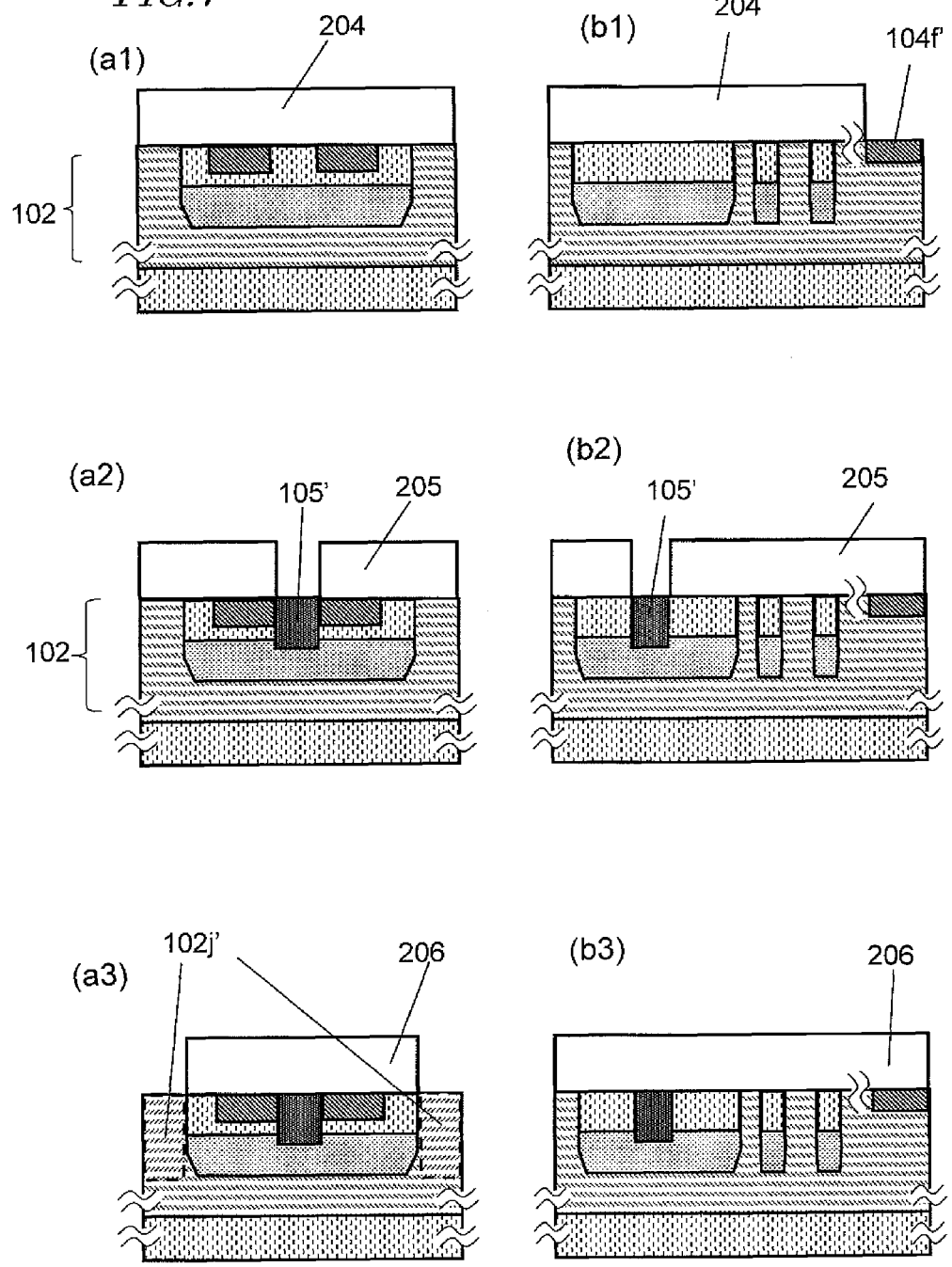
FIG. 7 Cross-sectional views illustrating respective manufacturing process steps to fabricate the semiconductor element 100, wherein (a1) through (a3) illustrate its unit cell region and (b1) through (b3) illustrate its diode region and terminal region.

Next, as shown in FIGS. 7(a1) and 7(b1), the masks 201, 202 and 202' are all removed and then another mask 204 is made on the first silicon carbide semiconductor layer 102. The mask 204 has an opening over a portion of the terminal region in which a stopper region will be defined. Subsequently, using the mask 204 as an implantation mask, N ions, for example, are implanted into the first silicon carbide semiconductor layer 102, thereby forming a stopper implanted region 104f. This ion implantation process step may be carried out under the same condition as the one for forming the source implanted region 104', for example.

Next, the mask 204 is removed and another mask 205 is made on the first silicon carbide semiconductor layer 102 as shown in FIGS. 7(a2) and 7(b2). The mask 205 has an opening over a contact region to be. Subsequently, using the mask 205 as an implantation mask, Al ions, for example, are implanted into the first silicon carbide semiconductor layer 102, thereby forming a contact implanted region 105'. In this process step, the contact implanted region 105' is formed inside a region to be the body region and a region to be the diode region. The implantation conditions of this process step may be selected so that the impurity concentration becomes approximately $1 \times 10^{20}$ cm$^{-3}$ and the depth becomes approximately 400 nm. In the unit cell region, the contact implanted region 105' is formed in the first body implanted region 103a' but suitably reaches the inside of the second body implanted region 103b' as shown in FIG. 7(a2). That is to say, the contact implanted region 105' suitably contacts with the first body implanted region 103a' at the upper portion of the side surface and with the second body implanted region 103b' at the lower portion and bottom of the side surface. After that, the mask 205 is removed.

Subsequently, as shown in FIGS. 7(a3) and 7(b3), another mask 206, having an opening over a JFET region to be, is made, if necessary, on the first silicon carbide semiconductor layer 102 and N ions are implanted into the drift region 102d, thereby forming a JFET implanted region 102j', which may have an impurity concentration approximately $1 \times 10^{17}$ cm$^{-3}$ and an implantation depth of approximately 0.6 to 1 μm.

It is recommended that these process steps of forming implanted regions by ion implantation described above be performed with the semiconductor substrate 101 heated to 200 degrees Celsius or more.

Figure 8:
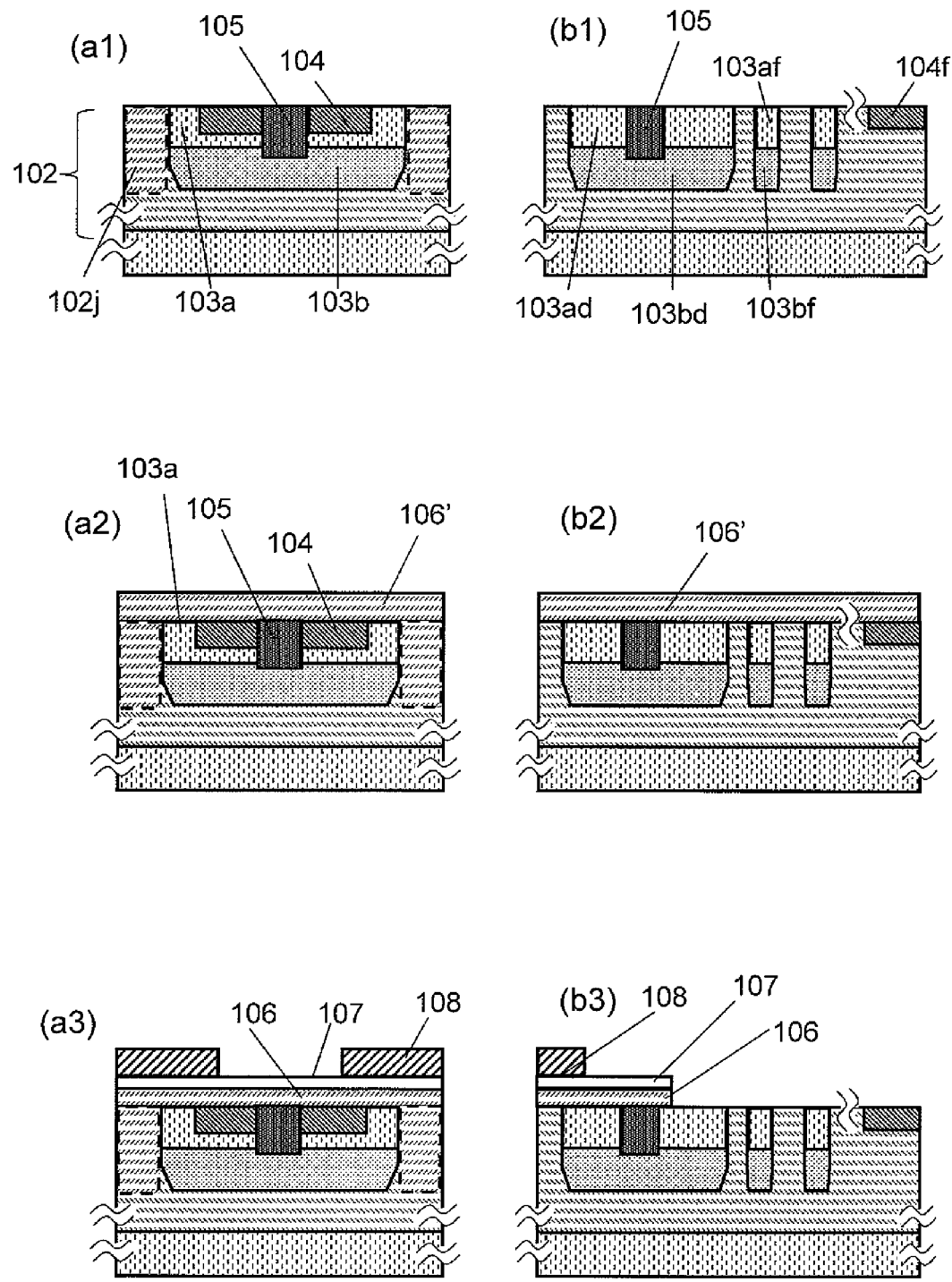
FIG. 8 Cross-sectional views illustrating respective manufacturing process steps to fabricate the semiconductor element 100, wherein (a1) through (a3) illustrate its unit cell region and (b1) through (b3) illustrate its diode region and terminal region.

After these ion implanted regions have been formed, the mask 206 is removed. Subsequently, an activation annealing process is carried out at an elevated temperature of approximately 1600 to 1900 degrees Celsius. As a result, as shown in FIGS. 8(a1) and 8(b1), the implanted regions 103a', 103b', 103ad', 103bd', 103af', 103bf', 104', 105' and 104f' can be turned into a first body region 103a, a second body region 103b, a high concentration region 103ad, a low concentration region 103bd, a high concentration ring region 103af, a low concentration ring region 103bf, an impurity region 104, a contact region 105 and a stopper region 104f, respectively. The activation annealing process is suitably carried out with a carbon film (not shown) deposited on the surface of the first silicon carbide semiconductor layer 102 (i.e., the surface in which the implanted regions have been formed). In this manner, it is possible to prevent the surface of the first silicon carbide semiconductor layer 102 from being roughened through the activation annealing process.

After the activation annealing process has been carried out, the carbon film deposited on the surface, if any, is removed. The carbon film can be removed by being exposed to oxygen plasma, for example. Thereafter, if necessary, the surface of the first silicon carbide semiconductor layer 102 can be cleaned by slightly oxidizing the surface of the first silicon carbide semiconductor layer 102 and removing the thermal oxide film (with a thickness of about 15 nm) thus formed.

Next, as shown in FIGS. 8(a2) and 8(b2), a layer 106' to be the second silicon carbide semiconductor layer (channel layer) is grown epitaxially over the entire surface of the first silicon carbide semiconductor layer 102, including the first body region 103a, the impurity region 104 and the contact region 105. In this embodiment, the thickness and impurity concentration of the second silicon carbide semiconductor layer 106' are adjusted appropriately so that the impurity concentration N (cm$^{-3}$) and the thickness d (nm) of the second silicon carbide semiconductor layer 106 will eventually satisfy the following conditions:

$$N = 2 \times 10^{18}$$

$$d = 30$$

The thickness d' of the layer 106' to be the second silicon carbide semiconductor layer is supposed to be d+d0 with respect to the thickness d of the second silicon carbide semiconductor layer, where d0 indicates the decrease in the thickness of the layer to be the second silicon carbide semiconductor layer owing to a thermal oxidation process to be described later. For example, if the decrease in thickness d0 is 50 nm, the thickness d' of the layer 106' to be the second silicon carbide semiconductor layer is 80 nm.

Next, as shown in FIGS. 8(a3) and 8(b3), a predetermined portion of the layer 106' to be the second silicon carbide semiconductor layer is dry-etched away, thereby obtaining the second silicon carbide semiconductor layer 106. In this process step, portions of the second silicon carbide semiconductor layer 106' which are located in the terminal region and diode region are removed. After that, a gate insulating film 107 is formed by thermal oxidation, for example, on the surface of the second silicon carbide semiconductor layer 106. Subsequently, a gate electrode 108 is formed on a predetermined portion of the gate insulating film 107.

If the gate insulating film 107 is formed by thermal oxidation, a part of the second silicon carbide semiconductor layer 106 will also form part of the gate insulating film 107. That is why the thickness of the layer 106' to be the second silicon carbide semiconductor layer (see FIG. 8(b1)) is adjusted with the decrease in thickness due to the thermal oxidation taken into account so that the second silicon carbide semiconductor layer 106 will have the thickness d when the gate insulating film 107 is formed. For example, if the thickness of the layer 206' to be the second silicon carbide semiconductor layer is set to be approximately 50 nm larger than the thickness d, the thickness of the second silicon carbide semiconductor layer 106 that will be obtained after having gone through the process step of cleaning the second silicon carbide semiconductor layer 106 to be performed before the gate insulating film 107 is formed and the process step of forming the gate insulating film 107 will be approximately equal to the predetermined thickness d.

The gate electrode 108 may be formed by depositing a polysilicon film doped with phosphorus at a dose of approximately $7 \times 10^{20}$ cm$^{-3}$ on the gate insulating film 107 and dry etching the polysilicon film through a mask (not shown). The polysilicon film may have a thickness of approximately 500 nm. The gate electrode 108 is arranged so as to cover a portion of the second silicon carbide semiconductor layer 106 that will be a channel.

In this embodiment, as the source region 104 and the body region 103 are formed by the self alignment process shown in FIG. 6(a2) and the second silicon carbide semiconductor layer 106 to be a channel layer is stacked on those regions, a portion to be the channel of a MISFET can be formed with good controllability. For example, if a portion to be a source region is formed on a layer corresponding to a channel layer as shown in FIG. 1 of Patent Document No. 1, the self alignment process cannot be applied to the body region, and therefore, there is a concern about a short circuit of the channel and an increase in ON-state resistance. For that reason, it is recommended that the second silicon carbide semiconductor layer 106 be formed over the source region 104 and body region 103 that have been formed by the self alignment process.

Figure 9:
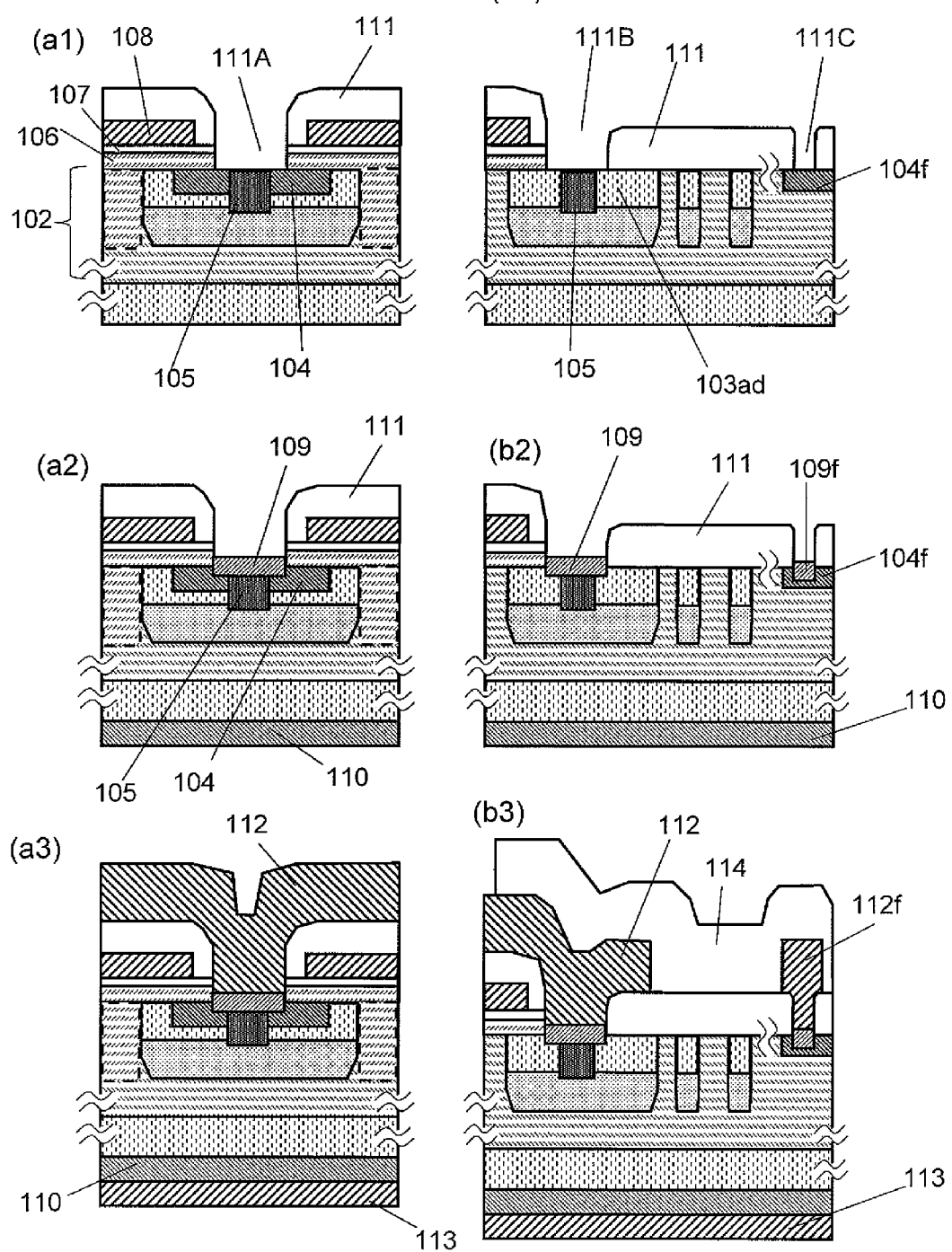
FIG. 9 Cross-sectional views illustrating respective manufacturing process steps to fabricate the semiconductor element 100, wherein (a1) through (a3) illustrate its unit cell region and (b1) through (b3) illustrate its diode region and terminal region.

Subsequently, as shown in FIGS. 9(a1) and 9(b1), an interlevel dielectric film 111 is deposited by CVD process, for example, so as to cover the respective surfaces of the gate electrode 108 and the first silicon carbide semiconductor layer 102. The interlevel dielectric film 111 may be made of $SiO_2$, for example, and has a thickness of 1 µm, for example. Next, the interlevel dielectric film 111, the gate insulating film 107 and the second silicon carbide semiconductor layer 106 are selectively dry-etched through a mask (not shown), thereby cutting a contact hole 111A that exposes a part of the surface of the impurity region 104 and the surface of the contact region 105, a contact hole 111B that exposes a part of the surface of the high concentration region 103ad and the surface of the contact region 105, and a contact hole 111C that exposes the surface of the stopper region 104f.

Thereafter, as shown in FIGS. 9(a2) and 9(b2), a first ohmic electrode 109 is formed inside the contact holes 111A and 111B and a contact electrode 109f is formed inside the contact hole 111C. Meanwhile, a second ohmic electrode 110 is formed on the other side (i.e., the back surface) of the semiconductor substrate 101 opposite from its principal surface.

In this embodiment, a metal film such as a nickel film is deposited to a thickness of about 100 nm, for example, to cover the interlevel dielectric film 111 and to fill the contact holes 111A, 111B and 111C. Next, a heat treatment is carried out at 950 degrees Celsius for five minutes, for example, within an inert atmosphere, thereby making the metal film (e.g., the nickel film in this embodiment) react with the surface of silicon carbide. After that, the nickel film on the interlevel dielectric film 111 and the residue of the nickel that has not reacted with the silicon carbide in the contact holes 111A, 111B and 111C are removed. In this manner, a first ohmic electrode 109 of a metal silicide (e.g., nickel silicide in this embodiment) is formed inside the contact holes 111A and 111B. In the meantime, a contact electrode 109f of nickel silicide is also formed inside the contact hole 111C. Likewise, the second ohmic electrode 110 may also be formed by depositing a nickel film, for example, over the entire back surface of the semiconductor substrate 101 and making the nickel film react with the silicon carbide surface of the semiconductor substrate 101 through a heat treatment. Optionally, before the heat treatment for forming the first ohmic electrode is carried out, a metal film may be deposited on the back surface of the semiconductor substrate 101 and the heat treatments for forming the first and second ohmic electrodes may be carried out at the same time.

Subsequently, a conductive film (such as an aluminum film) is deposited to a thickness of approximately 4 µm over the interlevel dielectric film 111 and inside the contact holes 111A, 111B and 111C and then selectively etched into an intended pattern. In this manner, an upper interconnect electrode 112 is formed over the interlevel dielectric film 111 and inside the contact holes 111A and 111E and an upper interconnect 112f is formed over the interlevel dielectric film 111 and inside the contact hole 111C as shown in FIGS. 9(a3) and 9(b3). Optionally, a passivation film 114 may be formed to cover an exposed portion of the interlevel dielectric film 111, the upper interconnect electrode 112 and the upper interconnect 112f. In the example illustrated in FIG. 9(b3), the passivation film 114 is arranged over the terminal region 100f and the diode region 115d. The passivation film 114 may be a SiN film and may have a thickness of approximately 1.5 µm, for example.

Although not shown, a gate line (or gate pad) which is electrically connected to the gate electrode 108 is formed in another region at the chip edge. Optionally, a back surface interconnect electrode 113 to be die-bonded may also be formed on the back surface of the second ohmic electrode 110. The back surface interconnect electrode 113 may be a multilayer film consisting of Ti, Ni and Ag films that have been stacked in this order on the second ohmic electrode 110. In that case, the Ti film contacts with the second ohmic electrode 110. In this manner, the semiconductor element 100 shown in FIG. 3 is completed.

The semiconductor element 100 of this embodiment includes the ring regions 103f, each of which is comprised of the high concentration ring region 103af and the low concentration ring region 103bf, in the terminal region 100f. That is why compared to the traditional semiconductor element 1000 (see FIG. 12) including the ring regions 1030f with a substantially uniform concentration profile, the decrease in breakdown voltage can be much less significant according to this embodiment. In addition, according to the method that has been described with reference to FIGS. 5 through 9, while the high and low concentration ring regions 103af and 103bf are formed, the first and second body regions 103a and 103b are also formed in the unit cell region and the high and low concentration regions 103ad and 103bd are also formed in the diode region at the same time. As a result, the process can be simplified. However, as long as the high and low concentration ring regions 103af and 103bf are formed simultaneously with the first and second body regions 103a and 103b and/or the high and low concentration regions 103ad and 103bd, the effect of simplifying the process can still be achieved.

In addition, according to the method described above, the regions having high impurity concentration and the regions having low impurity concentration are formed continuously using the same mask, and therefore, can be defined within the same area as viewed along a normal to the principal surface of the semiconductor substrate 101. That is why as there is no need to design the ring regions 103f at increased intervals by taking into account the possible misalignment between the patterns to be involved when the high and low concentration ring regions 103af and 103bf are formed by different processes, the area of the terminal region 100f can be reduced. In addition, it is also possible to avoid a situation where the JFET region (i.e., the interval between adjacent body regions) becomes narrower due to the misalignment between the patterns when the first and second body regions 103a and 103b are formed by different processes. As a result, the increase in the ON-state resistance of a MISFET due to the decrease in the area of the JFET region can also be minimized.

<Experiments to Examine the Effects Achieved by the Structure of Body Region 103>

Furthermore, the present inventors discovered and confirmed via experiments that if the first and second body regions 103a and 103b are formed while the high and low concentration ring regions 103af and 103bf are formed in the terminal region 100f as in the semiconductor element 100, the decrease in breakdown voltage in the unit cell region 100ul can also be checked.

For example, in the traditional semiconductor element 1000 shown in FIG. 12, the body region 1030 is formed so as to have a substantially constant impurity concentration in the depth direction, and therefore, the electric field could be overconcentrated at the bottom corners 3000 of the body region 1030 as well as in the ring region 1030f, and the intended breakdown voltage could not be obtained.

The results of the experiments carried out by the present inventors will be described in further detail. In the traditional semiconductor element 1000, the body region 1030 is supposed to have a substantially constant impurity concentration in the depth direction and have a depth of 0.6 μm, and the drift region 1020d is supposed to have a concentration of $1 \times 10^{16}$ cm$^{-3}$. When the body region 1030 has an average impurity concentration of $2 \times 10^{18}$ cm$^{-3}$, the breakdown voltage in the unit cell region becomes higher by 262 V than when the body region 1030 has an average impurity concentration of $2 \times 10^{19}$ cm$^{-3}$. This result revealed that the higher the concentration in the body region 1030, the more significantly the electric field got overconcentrated and the more steeply the breakdown voltage decreased. On the other hand, the present inventors confirmed that when the concentration profile in the depth direction of the ring regions 103f shown in FIG. 2 was applied to the body region 103, the decrease in breakdown voltage could be approximately 16 V smaller in the semiconductor element 100 of this embodiment than in a situation where the average impurity concentration in the body region 1030 was set to be $2 \times 10^{16}$ cm$^{-3}$ in the traditional semiconductor element 1000.

<Experiments to Examine the Effects Achieved by the Structures of Diode Region 115d and Terminal Region 100f>

The present inventors further carried out experiments to examine how the decrease in the breakdown voltage of the element could be checked by a pn junction diode formed by the region of the second conductivity type 103d, the ring regions 103f and the drift region 102d. The results are as follows.

In this case, supposing the impurity concentration in the high concentration region 103ad and the high concentration ring region 103af to be $2 \times 10^{19}$ cm$^{-3}$ and the impurity concentration in the low concentration region 103bd and the low concentration ring region 103bf to be approximately $2 \times 10^{18}$ cm$^{-3}$, the breakdown voltage of the terminal structure including the region of the second conductivity type 103d and the ring regions 103f was obtained as an example of the present invention. On the other hand, as a comparative example, the breakdown voltage of a terminal structure including the p-type region 1030d and ring regions 1030f with a substantially uniform concentration profile in the depth direction as shown in FIG. 12(c) was obtained. The p-type region 1030d and the ring regions 1030f were supposed to have an impurity concentration of approximately $2 \times 10^{18}$ cm$^{-3}$. Also, the region of the second conductivity type 103d of the example of the present invention and the p-type region 1030d of the comparative example were supposed to have the same appearance in terms of their depth and width, for example. In the same way, the respective ring regions 103f and 1030f of the example of the present invention and the comparative example were supposed to have the same depth and same width and be provided in the same number.

Figure 10:
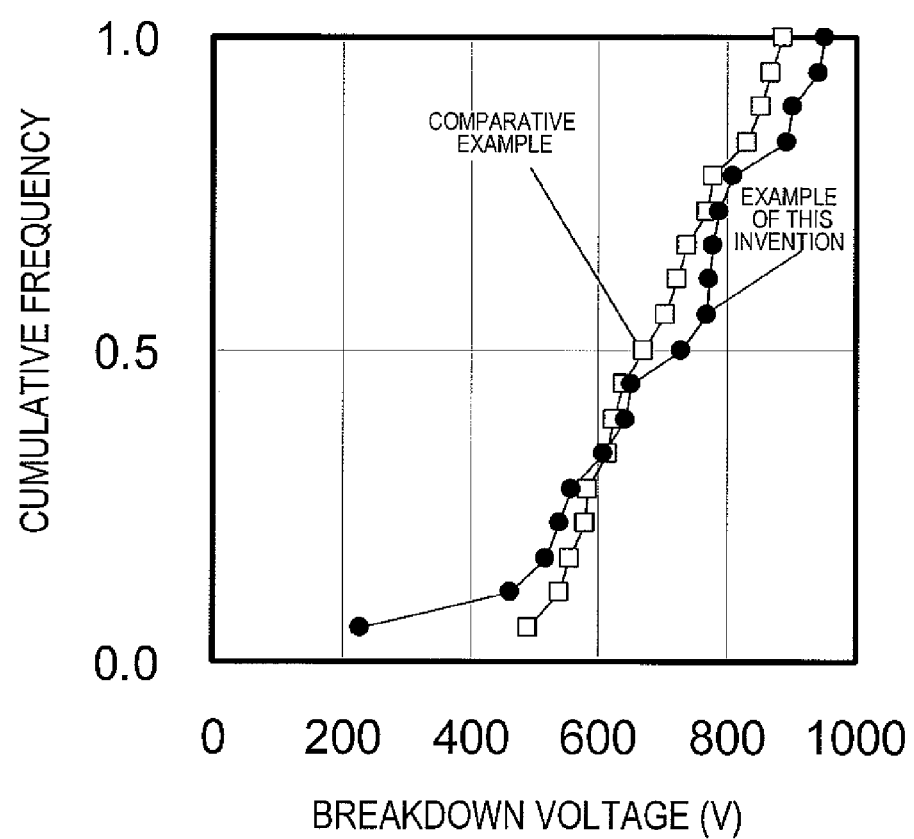
FIG. 10 A graph showing the cumulative frequency distributions of breakdown voltages when the terminal structures of an example of the present invention and a comparative example (i.e., a pn diode) were adopted, respectively.

FIG. 10 is a graph showing the cumulative frequency distributions of element's breakdown voltages when the terminal structure of the example of the present invention and that of the comparative example (i.e., the pn junction diode) were adopted, respectively. As can be seen from the results shown in this graph, if the impurity concentration in the diode and ring regions was increased in an upper (i.e., shallower) portion (as in the example of the present invention), an element with a higher breakdown voltage was realized than in a situation where the entire diode and ring regions had identical impurity concentration (as in the comparative example). Comparing their median values, the element's breakdown voltage achieved by the terminal structure of the comparative example was 671 V, while an element's breakdown voltage of 728 V was achieved by the terminal structure of the example of the present invention.

As each unit cell 100u of this embodiment includes a body region 103 comprised of first and second body regions 103a and 103b with different concentrations, the breakdown voltage of the element can be decreased. On top of that, by controlling the impurity concentrations of the upper and lower layers of the body region 103 independently of each other, the following effect can also be obtained.

By appropriately selecting the impurity concentration in the first body region 103a, the impurity concentration and thickness of the second silicon carbide semiconductor layer 106, and the thickness of the gate insulating film 107, if the potential of the gate electrode 108 with respect to the potential of the first ohmic electrode 109 is equal to or greater than zero but less than the threshold voltage Vth of the transistor, the semiconductor element 100 can also function as a diode which makes current flow from the first ohmic electrode (source electrode) 109 toward the second ohmic electrode (drain electrode) 110 through the second silicon carbide semiconductor layer (channel layer) 106 while keeping the threshold voltage Vth of the transistor positive (i.e., while maintaining the transistor in normally off state). For example, suppose the first body region 103a has an average impurity concentration of $2 \times 10^{19}$ cm$^{-3}$, the second silicon carbide semiconductor layer 106 has an impurity concentration of $2.3 \times 10^{18}$ cm$^{-3}$ and a thickness of 30 nm, and the gate insulating film 107 has a thickness of 70 nm. With such settings adopted, the semiconductor element 100 can set the turn-on voltage of the diode (i.e., the voltage between the first and second ohmic electrodes (i.e., source and drain electrodes) 109 and 110 that needs to be applied to flow a current of 1 mA in absolute value through the diode) to be approximately 0.5 V while keeping the threshold voltage of the transistor positive, and has a totally different current-voltage characteristic from a pn diode comprised of the body region 103 and the drift region 102d (with a turn-on voltage of approximately 2.5 V). If the semiconductor element 100 is made to operate as a diode, that diode will be referred to herein as a "channel diode" for convenience sake.

In this description, the potential of the second ohmic electrode D with respect to the potential of the first ohmic electrode S is identified herein by Vds, the potential of the gate electrode G with respect to the potential of the first ohmic electrode S is identified herein by Vgs, the direction of current flowing from the second ohmic electrode D toward the first ohmic electrode S is defined herein to be "forward direction" and the direction of current flowing from the first ohmic electrode S toward the second ohmic electrode is defined herein to be "reverse direction". These potentials and voltages are both expressed in volts (V).

The semiconductor element 100 of the present invention can control, independently of each other, the second body region 103b that affects the breakdown voltage of the element and the first body region 103a that affects the threshold voltage Vth of the transistor and the turn-on voltage Vf0 of the channel diode. As a result, the channel diode can be used as a freewheeling diode which is connected anti-parallel to a transistor in an inverter circuit, and a highly reliable semiconductor element with a high breakdown voltage can be provided.

In order to decrease the turn-on voltage |Vf0| of the channel diode (to 1 V or less to say the least, and to 0.6 V if possible) while keeping the breakdown voltage of the element high enough and to maintain a positive threshold voltage Vth (which suitably falls within the range of 2 V through 8 V) for the transistor, it would be beneficial to set the average impurity concentration of the second body region 103b to be lower than that of the first body region 103a. If the turn-on voltage of the channel diode is set to be 1 V or less, the Schottky diode of SiC, which is a candidate for a freewheeling diode, can be replaced. And if the turn-on voltage of the channel diode is set to be 0.6 V or less, a fast recovery diode of Si can be replaced. That is to say, the semiconductor element 100 can also function as a freewheeling diode by itself, and therefore, there is no need to use any of these freewheeling diodes anymore.

If a channel diode with a low turn-on voltage (of 1 V or less) works, a large amount of current can be obtained with almost no current allowed to flow through a body diode that has a pn junction formed by the body region 103 and the drift region 102d. In the traditional semiconductor element, if a large amount of current is allowed to flow through a pn junction continuously, imperfections in SiC will grow to cause an increase in the ON-state resistance of the semiconductor element and in the resistance of the body diode, which is a problem. However, the semiconductor element 100 of this embodiment can function as a diode almost without allowing current to flow through the body diode. As a result, high reliability can be maintained without increasing the crystal imperfections.

Furthermore, the threshold voltage Vth of the forward current is suitably 2 V or more. A semiconductor element to be ordinarily used in an inverter circuit that is a power circuit is suitably normally OFF (i.e., Vth>0 V). This is because even if the gate controller went out or order and the gate voltage went 0 V for some reason, the drain current could still be shut off safely in that case. Also, the higher the temperature, the lower the threshold voltage of a MISFET tends to be. For example, in the case of an SiC-MISFET, a rise in temperature of 100 degrees Celsius could cause a decrease of approximately 1 V. In this case, supposing the noise margin is 1 V in order to prevent the gate from being turned ON accidentally due to noise, Vth at room temperature is suitably set to be equal to or higher than 2 V (=1 V+1 V). Also, if the threshold voltage were too high, the gate voltage to be applied to turn the transistor ON would increase accordingly, and a lot of constraints would be imposed on the power supply to generate the gate voltage. For that reason, it is recommended to set the threshold voltage to be 8 V or less in practice.

Figure 11:
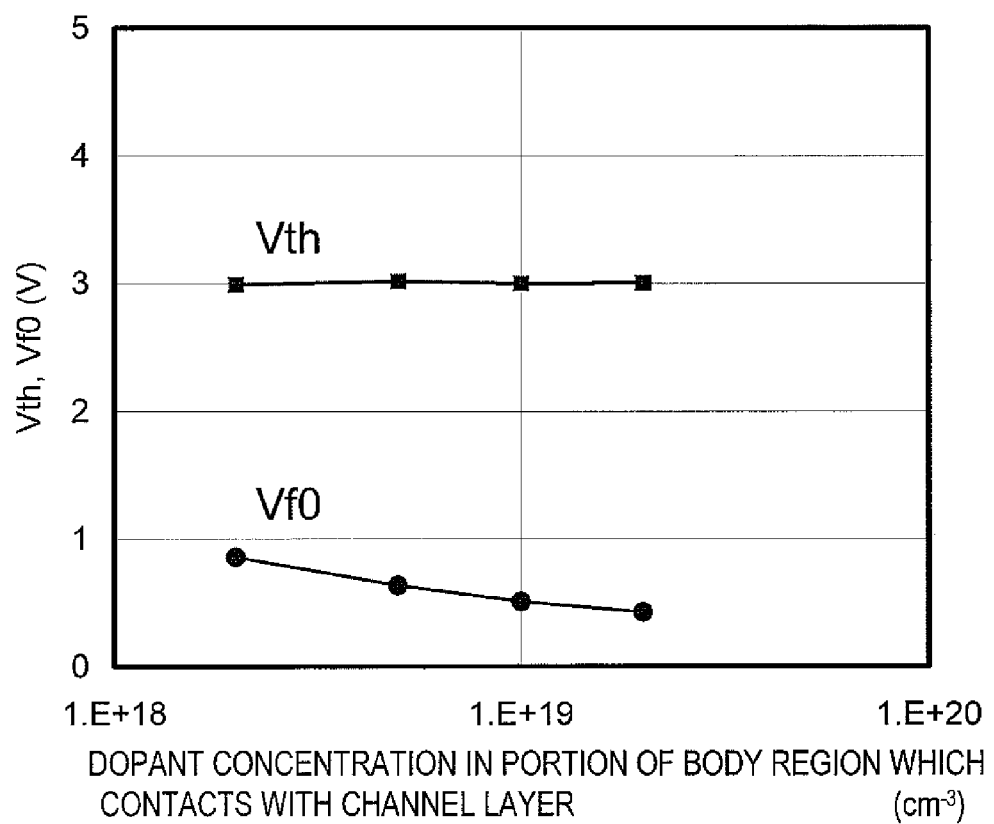
FIG. 11 A graph showing how the turn-on voltage Vf0 of a channel diode changes when the concentration in the body region is changed with the threshold voltage Vth of the semiconductor element 100 kept constant.

FIG. 11 shows how the threshold voltage Vth of the transistor and the turn-on voltage Vf0 of the channel diode change with the impurity concentration in a portion of the body region 103 that contacts with the second silicon carbide semiconductor layer 106 (i.e., the channel layer), e.g., the impurity concentration in the first body region 103a in this example. If the impurity concentration in the first body region 103a is changed, the threshold voltage Vth changes accordingly. In this example, however, the threshold voltage Vth is set to be approximately 3 V by appropriately changing the impurity concentration in the second silicon carbide semiconductor layer 106.

As can be seen from FIG. 11, supposing the threshold voltage Vth is constant, the higher the impurity concentration in the first body region 103a, the lower the turn-on voltage Vf0 tends to be. That is why it can be seen that to decrease the turn-on voltage Vf0 of the channel diode while maintaining the threshold voltage Vth of the transistor, the impurity concentration in the first body region 103a is suitably as high as possible.

In this manner, according to this embodiment, the breakdown voltage of the element, the turn-on voltage of the built-in diode, and the threshold voltage of the transistor can be controlled independently of each other. The impurity concentrations and thicknesses of the respective regions are suitably selected by performing the process step of controlling the absolute value of a voltage, at which current starts to flow from the first ohmic electrode 109 toward the second ohmic electrode 110 when the first ohmic electrode 109 and the gate electrode 108 have an equal potential, while keeping the threshold voltage Vth of the semiconductor element 100 constant, by adjusting the impurity concentration and thickness of the second silicon carbide semiconductor layer 106 while varying the impurity concentration of the first body region 103a during the design process of the semiconductor element 100.

The present invention is in no way limited to the embodiments described above. Silicon carbide does not have to be 4H—SiC but may also have any other poly-type (such as 6H—SiC, 3C—SiC, or 15R—SiC). Also, although the principal surface of the semiconductor substrate 101 is supposed to have a plane orientation that has been off-axis cut with respect to a (0001) plane in the embodiments described above, the principal surface may also be any other plane (such as a (11-20) plane, a (1-100) plane, or a (000-1) plane) or an off-axis cut plane thereof. Optionally, the semiconductor element 100 may have a heterojunction. For example, a Si substrate may be used as the semiconductor substrate 101 and a silicon carbide semiconductor layer (3C—SiC) may be formed as the first silicon carbide semiconductor layer 102 on the Si substrate.

INDUSTRIAL APPLICABILITY

The present invention provides a silicon carbide semiconductor element which can check a decrease in breakdown voltage in the terminal region, and also provides semiconductor element fabricating method, by which the increase in ON-state resistance can be minimized and the element can be fabricated by a simplified process. Thus, the present invention is applicable to various kinds semiconductor devices that use silicon carbide, and can be used particularly effectively in a power semiconductor device to be used as a switching element for an inverter circuit, for example.

REFERENCE SIGNS LIST 100 semiconductor element
100*ul* unit cell region
100*f* terminal region
101 semiconductor substrate
102 first silicon carbide semiconductor layer
102*d* drift region
102*j* JFET region
103 body region
103*a* first body region
103*b* second body region
103*f* ring region
103*af* high concentration ring region
103*bf* low concentration ring region
103*d* diode region
103*ad* high concentration region
103*bd* low concentration region
104 impurity region (source region)

105 contact region
106 second silicon carbide semiconductor layer (channel layer)
107 gate insulating film
108 gate electrode
109 first ohmic electrode (source electrode)
110 second ohmic electrode (drain electrode)
111 interlevel dielectric film
112 upper interconnect electrode
113 back surface interconnect electrode
115d diode region

The invention claimed is:

1. A semiconductor element comprising a substrate of a first conductivity type and a first silicon carbide semiconductor layer which is arranged on the principal surface of the substrate and which includes a drift region of the first conductivity type,
wherein as viewed along a normal to the principal surface of the substrate, the semiconductor element has a unit cell region and a terminal region which is located between the unit cell region and an edge of the semiconductor element, and
wherein the terminal region includes a ring region of a second conductivity type which is arranged in the first silicon carbide semiconductor layer so as to contact with the drift region, and
wherein the ring region includes a high concentration ring region which contacts with the surface of the first silicon carbide semiconductor layer and a low concentration ring region which contains an impurity of the second conductivity type at a lower concentration than in the high concentration ring region and the bottom of which contacts with the first silicon carbide semiconductor layer, and
wherein a side surface of the high concentration ring region contacts with the drift region, and
wherein as viewed along a normal to the principal surface of the substrate, the high concentration ring region and the low concentration ring region are identical in contour, and
wherein the unit cell region has a plurality of unit cells, and
wherein each said unit cell includes:
a body region of the second conductivity type which is arranged adjacent to the drift region in the first silicon carbide semiconductor layer;
an impurity region of the first conductivity type which is arranged in the body region;
a second silicon carbide semiconductor layer of the first conductivity type which is arranged on the first silicon carbide semiconductor layer so as to contact with at least a part of the body region and with at least a part of the impurity region;
a gate insulating film which is arranged on the second silicon carbide semiconductor layer;
a gate electrode which is arranged on the gate insulating film;
a first ohmic electrode which is electrically connected to the impurity region; and
a second ohmic electrode which is arranged on the other side of the substrate opposite from its principal surface, and
wherein the body region includes
a first body region which contacts with the second silicon carbide semiconductor layer at least partially; and
a second body region which contains an impurity of the second conductivity type at a lower concentration than in the first body region and the bottom of which contacts with the first silicon carbide semiconductor layer, and
wherein supposing the threshold value of the semiconductor element as a transistor is Vth, if the potential of the gate electrode with respect to the potential of the first ohmic electrode is equal to or greater than zero but less than Vth, the semiconductor element functions as a diode which makes current flow from the first ohmic electrode toward the second ohmic electrode through the second silicon carbide semiconductor layer.

2. The semiconductor element of claim 1, wherein the average impurity concentration of the high concentration ring region is twice or more as high as that of the low concentration ring region.

3. The semiconductor element of claim 1, wherein as measured along a normal to the principal surface of the substrate, the high concentration ring region has a thickness of 15 nm or more and the low concentration ring region has a thickness of 100 nm or more.

4. The semiconductor element of claim 1, further comprising a diode region which is arranged between the unit cell region and the terminal region when viewed along a normal to the principal surface of the substrate, and wherein the diode region has, in the first silicon carbide semiconductor layer, a region of the second conductivity type which is arranged so as to contact with the drift region, and
wherein the region of the second conductivity type includes a high concentration region which contacts with the surface of the first silicon carbide semiconductor layer and a low concentration region which contains the impurity of the second conductivity type at a lower concentration than in the high concentration region and the bottom of which contacts with the drift region, and
wherein as viewed along a normal to the principal surface of the substrate, the high concentration region and the low concentration region are identical in contour.

5. The semiconductor element of claim 4, wherein the average impurity concentration of the high concentration region is twice or more as high as that of the low concentration region.

6. The semiconductor element of claim 4, wherein as measured along a normal to the principal surface of the substrate, the high concentration region has a thickness of 15 nm or more and the low concentration region has a thickness of 100 nm or more.

7. The semiconductor element of claim 4, wherein the ring region and the region of the second conductivity type have substantially identical impurity concentration profiles in a depth direction.

8. The semiconductor element of claim 1, wherein the body region and the ring region have substantially identical impurity concentration profiles in the depth direction.

9. The semiconductor element of claim 1, wherein as viewed along a normal to the principal surface of the substrate, the first body region and the second body region are identical in contour.

10. The semiconductor element of claim 1, wherein the high concentration ring region and the low concentration ring region have been formed by implanting ions of an impurity of the second conductivity type into respective portions of the first silicon carbide semiconductor layer using a same implantation mask.

11. The semiconductor element of claim 4, wherein the high concentration region and the low concentration region have been formed by implanting ions of an impurity of the second conductivity type into respective portions of the first silicon carbide semiconductor layer using a same implantation mask.

12. The semiconductor element of claim 1, wherein the first body region and the second body region have been formed by implanting ions of an impurity of the second conductivity type into respective portions of the first silicon carbide semiconductor layer using a same implantation mask.

13. A method for fabricating the semiconductor element of claim 1, comprising the step of forming the high concentration ring region and the low concentration ring region by implanting ions of an impurity of the second conductivity type into respective portions of the first silicon carbide semiconductor layer using a same implantation mask.

14. A method for fabricating the semiconductor element of claim 4, comprising the step of forming the high concentration ring region, the low concentration ring region, the high concentration region and the low concentration region by implanting ions of an impurity of the second conductivity type into respective portions of the first silicon carbide semiconductor layer using a same implantation mask.

15. A method for fabricating the semiconductor element of claim 1, comprising the step of forming the high concentration ring region, the low concentration ring region, the first body region and the second body region by implanting ions of an impurity of the second conductivity type into respective portions of the first silicon carbide semiconductor layer using a same implantation mask.

16. A method for fabricating the semiconductor element of claim 1, the semiconductor element further comprising a diode region which is arranged between the unit cell region and the terminal region, the diode region having, in the first silicon carbide semiconductor layer, a region of the second conductivity type which is arranged so as to contact with the drift region, the region of the second conductivity type including a high concentration region which contacts with the surface of the first silicon carbide semiconductor layer and a low concentration region which contains the impurity of the second conductivity type at a lower concentration than in the high concentration region and the bottom of which contacts with the drift region, and wherein the method for fabricating the semiconductor element includes the step of forming the high concentration ring region, the low concentration ring region, the first body region, the second body region, the high concentration region and the low concentration region by implanting ions of an impurity of the second conductivity type into respective portions of the first silicon carbide semiconductor layer using a same implantation mask.

17. The semiconductor element of claim 1, wherein the second silicon carbide semiconductor layer does not contact with the ring region.

18. The semiconductor element of claim 1, wherein if the potential of the gate electrode with respect to the potential of the first ohmic electrode is 1 V or less, the semiconductor element functions as a diode that makes current flow from the first ohmic electrode toward the second ohmic electrode through the second silicon carbide semiconductor layer.

19. The semiconductor element of claim 1, wherein if the potential of the gate electrode with respect to the potential of the first ohmic electrode is 0.6 V or less, the semiconductor element functions as a diode that makes current flow from the first ohmic electrode toward the second ohmic electrode through the second silicon carbide semiconductor layer.

* * * * *